(12) United States Patent
Naito et al.

(10) Patent No.: US 7,593,104 B2
(45) Date of Patent: Sep. 22, 2009

(54) METHOD FOR MANUFACTURING OPTICAL MODULE, POSITIONING APPARATUS, EVALUATION METHOD AND EVALUATION APPARATUS FOR EVALUATING OPTICAL MODULE

(75) Inventors: Nobuhiro Naito, Chino (JP); Akira Miyamae, Fujimi-machi (JP)

(73) Assignee: Seiko Epson Corporation (JP)

( * ) Notice: Subject to any disclaimer, the term of this patent is extended or adjusted under 35 U.S.C. 154(b) by 420 days.

(21) Appl. No.: 11/536,768

(22) Filed: Sep. 29, 2006

(65) Prior Publication Data

US 2007/0091312 A1    Apr. 26, 2007

(30) Foreign Application Priority Data

Oct. 24, 2005 (JP) ............................. 2005-308585
Jun. 12, 2006 (JP) ............................. 2006-162232

(51) Int. Cl.
   *G01B 11/00* (2006.01)
(52) U.S. Cl. ........................... 356/399; 356/153; 385/52
(58) Field of Classification Search ................ 356/399, 356/400, 153, 614, 622; 385/52, 88–93
   See application file for complete search history.

(56) References Cited

U.S. PATENT DOCUMENTS 4,749,250 A * 6/1988 Carter .......................... 385/52
6,851,870 B1 * 2/2005 Deng et al. .................... 385/93
6,886,997 B2   5/2005 Cheung et al.

FOREIGN PATENT DOCUMENTS

| JP | 11-230865   | 8/1999  |
|----|-------------|---------|
| JP | 2000-035525 | 2/2000  |
| JP | 2001-138084 | 5/2001  |
| JP | 2004-258655 | 9/2004  |
| JP | 2005-077436 | 3/2005  |
| JP | 2005-329896 | 12/2005 |

* cited by examiner

*Primary Examiner*—L. G Lauchman
(74) *Attorney, Agent, or Firm*—Harness, Dickey & Pierce, P.L.C.

(57) ABSTRACT

A method for evaluating an optical module, the optical module including a light emitting element and a supporting member for supporting an end of an optical fiber for communications, by which relative positions of the light emitting element and the supporting member are evaluated, the method including the steps of: (a) supporting an end of an optical fiber for evaluation at the supporting member; (b) propagating light emitted from the light emitting element through the optical fiber for evaluation; and (c) detecting the amount of only a portion of components of light including an optical axis thereof emitted from the light emitting element by a photodetector provided at the other end of the optical fiber for evaluation.

6 Claims, 22 Drawing Sheets

METHOD FOR MANUFACTURING OPTICAL MODULE, POSITIONING APPARATUS, EVALUATION METHOD AND EVALUATION APPARATUS FOR EVALUATING OPTICAL MODULE

The entire disclosure of Japanese Patent Application No. 2005-308585, filed Oct. 24, 2005 and No. 2006-162232, filed Jun. 12, 2006 are expressly incorporated by reference herein.

BACKGROUND

1. Technical Field

The present invention relates to evaluation methods and evaluation apparatuses for evaluating optical modules.

2. Related Art

For an optical module including a light emitting element and a connector part for supporting one end of an optical fiber, it is necessary to evaluate the coupling efficiency between the light emitting element and the optical fiber. As a concrete example of such evaluation, the optical fiber is mounted on the connector part, the light emitting element is made to emit light, the outgoing light is made incident upon one end of the optical fiber, and the amount of light is observed at the other end of the optical fiber, whereby the optical module can be evaluated. In this instance, as the amount of light (the intensity of outgoing light) is observed while shifting the position of the one end of the optical fiber, a trapezoidal tolerance curve without having a clear peak is obtained. Because a clear peak cannot be obtained, an accurate evaluation cannot be consistently made. In this respect, an example of related art is described in Japanese Laid-open Patent Application JP-A-11-230865.

SUMMARY

In accordance with an advantage of some aspects of the present invention, an evaluation technique that suits to mass-production of optical modules can be provided.

A method for evaluating an optical module in accordance with an embodiment of the invention pertains to a method for evaluating an optical module, the optical module including a light emitting element and a supporting member for supporting an end of an optical fiber for communications, by which relative positions of the light emitting element and the supporting member are evaluated, and the method includes the steps of: (a) supporting an end of an optical fiber for evaluation at the supporting member; (b) propagating light emitted from the light emitting element through the optical fiber for evaluation; and (c) detecting the amount of only a portion of components of light including an optical axis thereof emitted from the light emitting element by a photodetector provided at the other end of the optical fiber for evaluation.

In the method for evaluating an optical module in accordance with an aspect of the embodiment of the invention, in the step (c), the amount of only a portion of components of light including an optical axis thereof emitted from the optical fiber for evaluation may be detected by the photodetector provided at the other end of the optical fiber for evaluation.

In the method for evaluating an optical module in accordance with an aspect of the embodiment of the invention, a light receiving surface of the photodetector may be provided at a position that receives only a portion of components of light including an optical axis thereof emitted from the optical fiber for evaluation.

In the method for evaluating an optical module in accordance with an aspect of the embodiment of the invention, the light receiving surface of the photodetector may be smaller than a spot diameter of light emitted from the optical fiber for evaluation.

In the method for evaluating an optical module in accordance with an aspect of the embodiment of the invention, in the step (c), a diaphragm member may be provided between the photodetector and the optical fiber for evaluation, such that the amount of only a portion of components of light including an optical axis thereof emitted from the optical fiber for evaluation can be detected.

In the method for evaluating an optical module in accordance with an aspect of the embodiment of the invention, in the step (c), a diaphragm member may be provided between the photodetector and the light emitting element, such that the amount of only a portion of components of light including an optical axis thereof emitted from the light emitting element can be detected.

In the method for evaluating an optical module in accordance with an aspect of the embodiment of the invention, the optical fiber for evaluation may include a first optical fiber for evaluation having one end supported by the supporting member and a second optical fiber for evaluation that is optically coupled with the other end of the first optical fiber for evaluation, and the diaphragm member may be provided between the first optical fiber for evaluation and the second optical fiber for evaluation.

In the method for evaluating an optical module in accordance with an aspect of the embodiment of the invention, the optical fiber for evaluation may have a core diameter that is smaller than a core diameter of the optical fiber for communications.

In the method for evaluating an optical module in accordance with an aspect of the embodiment of the invention, the optical fiber for evaluation may have a core diameter that is smaller than a spot diameter of light emitted from the light emitting element at the one end of the optical fiber for evaluation.

The method for evaluating an optical module in accordance with an aspect of the embodiment of the invention may further include, after the step (c), the step of evaluating relative positions of the light emitting element and the optical fiber based of the amount of light detected by the photodetector.

In the method for evaluating an optical module in accordance with an aspect of the embodiment of the invention, in the step (b), light may be emitted by the light emitting element while shifting the position of one end of the optical fiber for evaluation.

In the method for evaluating an optical module in accordance with an aspect of the embodiment of the invention, in the step (a), a ferule provided at one end of the optical fiber for evaluation may be supported by the supporting member; and in the step (b), a force may be applied to the ferule to thereby shift the position of the one end of the optical fiber for evaluation.

In the method for evaluating an optical module in accordance with an aspect of the embodiment of the invention, relative positions of the light emitting element and the optical fiber may be evaluated based on the amount of light measured at each position of the one end of the optical fiber for evaluation.

An apparatus for evaluating an optical module in accordance with an embodiment of the invention pertains to an apparatus for evaluating an optical module, the optical module including a light emitting element and a supporting member for supporting an end of an optical fiber for communications, by which relative positions of the light emitting element and the supporting member are evaluated, and the apparatus includes: an optical fiber for evaluation having one end supported by the supporting member of the optical module, and a photodetector that is provided at the other end of the optical fiber for evaluation and detects the amount of only a portion of components of light including an optical axis thereof emitted from the light emitting element.

The apparatus for evaluating an optical module in accordance with an aspect of the embodiment of the invention may further include a diaphragm member that is provided between the light emitting element and the photodetector, and transmits only a portion of components of light including an optical axis thereof emitted from the light emitting element.

In the apparatus for evaluating an optical module in accordance with an aspect of the embodiment of the invention, the optical fiber for evaluation may have a first optical fiber for evaluation having one end supported by the supporting member and a second optical fiber for evaluation that is optically coupled with the other end of the first optical fiber for evaluation, and the diaphragm member may be provided between the first optical fiber for evaluation and the second optical fiber for evaluation.

In the apparatus for evaluating an optical module in accordance with an aspect of the embodiment of the invention, a light receiving surface of the photodetector may be smaller than a spot diameter of light emitted from the optical fiber for evaluation.

In the apparatus for evaluating an optical module in accordance with an aspect of the embodiment of the invention, the optical fiber for evaluation may have a core diameter that is smaller than a core diameter of the optical fiber for communications.

In the apparatus for evaluating an optical module in accordance with an aspect of the embodiment of the invention, the optical fiber for evaluation may have a core diameter that is smaller than a spot diameter of light emitted from the light emitting element at the one end of the optical fiber for evaluation.

The apparatus for evaluating an optical module in accordance with an aspect of the embodiment of the invention may further include a pressure applicator to apply a force to the optical fiber for evaluation for moving the position of one end of the optical fiber for evaluation.

DESCRIPTION OF EXEMPLARY EMBODIMENTS

Figure 1:
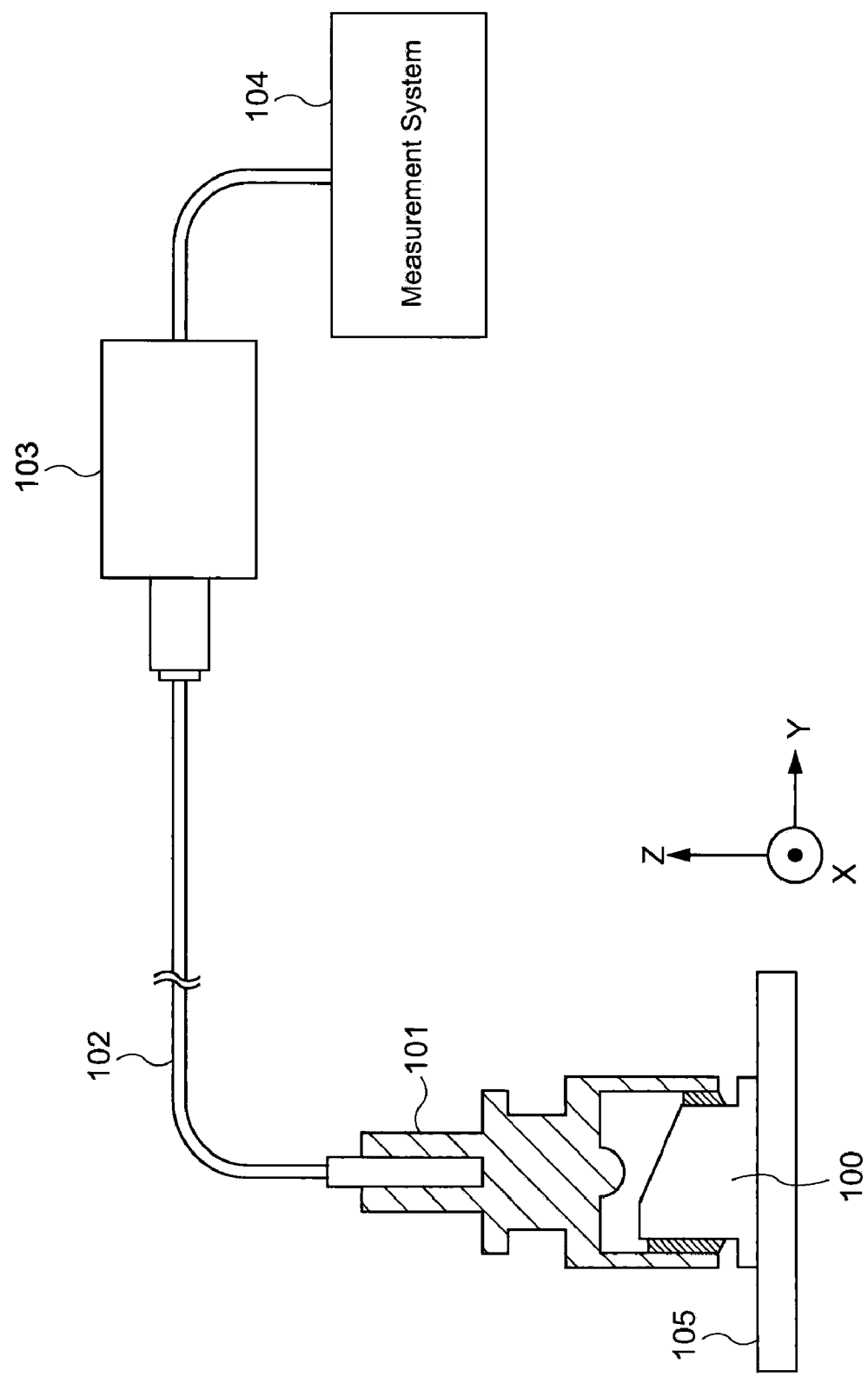
FIG. 1 is a schematic block diagram for describing the structure of an apparatus for manufacturing an optical module in accordance with a first embodiment of the invention.

1. Method For Manufacturing Optical Module and Positioning Apparatus 1.1. First Embodiment FIG. 1 is a schematic block diagram for describing the structure of an apparatus for manufacturing an optical module in accordance with a first embodiment of the invention. The apparatus shown in FIG. 1 is an apparatus (positioning apparatus) for positioning a can package 100 that is formed with a light emitting element contained therein and a connector part (supporting component) that supports one end of an optical fiber with respect to each other, and has a structure including an optical fiber 102, a sensor unit 103, a measurement system 104, and a moveable stage 105.

Figure 2:
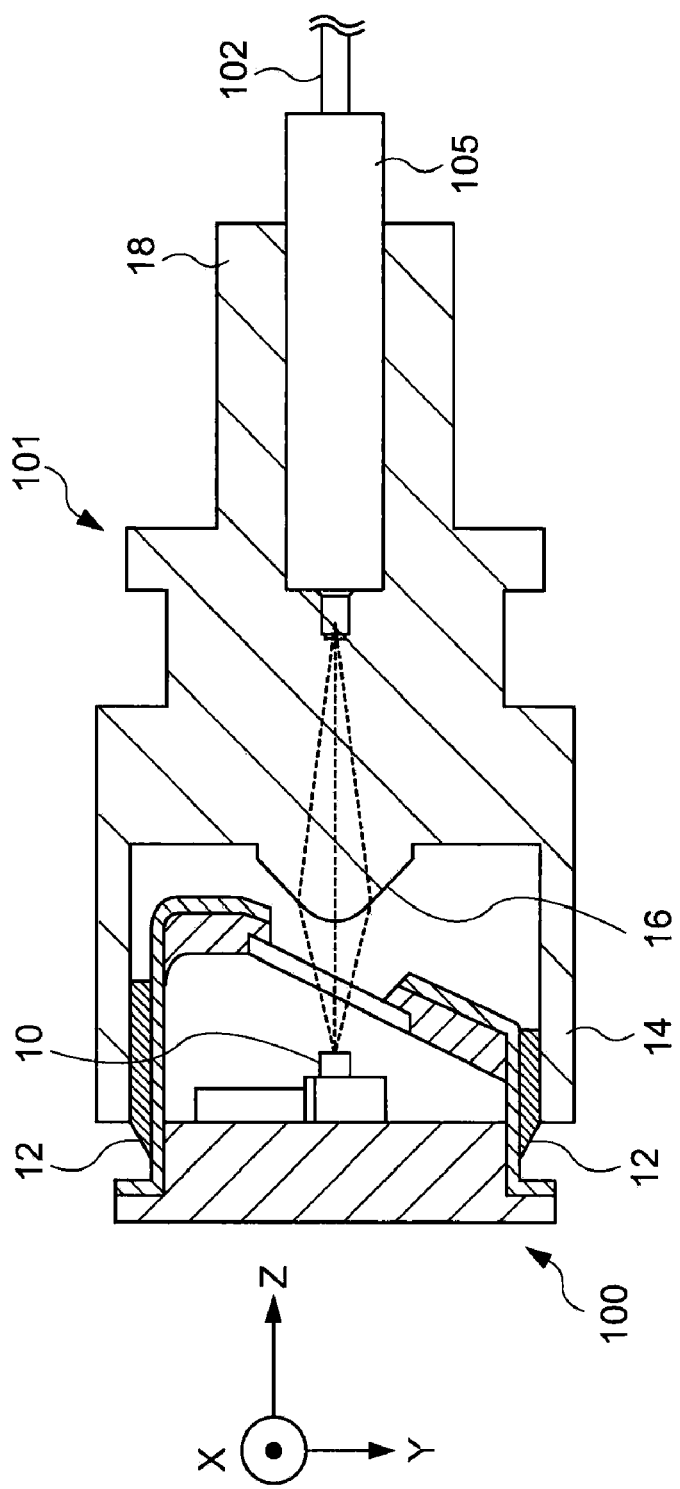
FIG. 2 is a cross-sectional view for describing the structure of the optical module in detail.

FIG. 2 is a cross-sectional view for describing the structure of the optical module in greater detail. In the optical module in accordance with the present embodiment, the can package 100 and the connector part 101 are positioned with each other, and affixed together with adhesive 12.

The can package 100 includes a light emitting element 10 that is packaged within a container housing composed of metal or the like. The light emitting element 10 is, for example, a VCSEL (vertical cavity surface emitting diode) that emits light in a multimode oscillation.

The connector part 101 is equipped with a bore-like supporting section 14 that supports the can package 100, a lens section 16 that is disposed in alignment with an optical axis of the light emitting element 10, focuses light emitted from the light emitting element 10 and leads the light to one end of the optical fiber 102, and a sleeve section 18 with one end of the optical fiber 102 mounted thereon and supports the optical fiber 102. In the present example, a ferule is mounted on one end of the optical fiber 102, and the ferule is inserted in the sleeve section 18. It is noted that the optical fiber 102 may be, for example, a GI (graded index) multimode fiber with a numerical aperture (NA) being 0.21, having a core diameter of 50 μm and a clad diameter of 125 μm.

Figure 3:
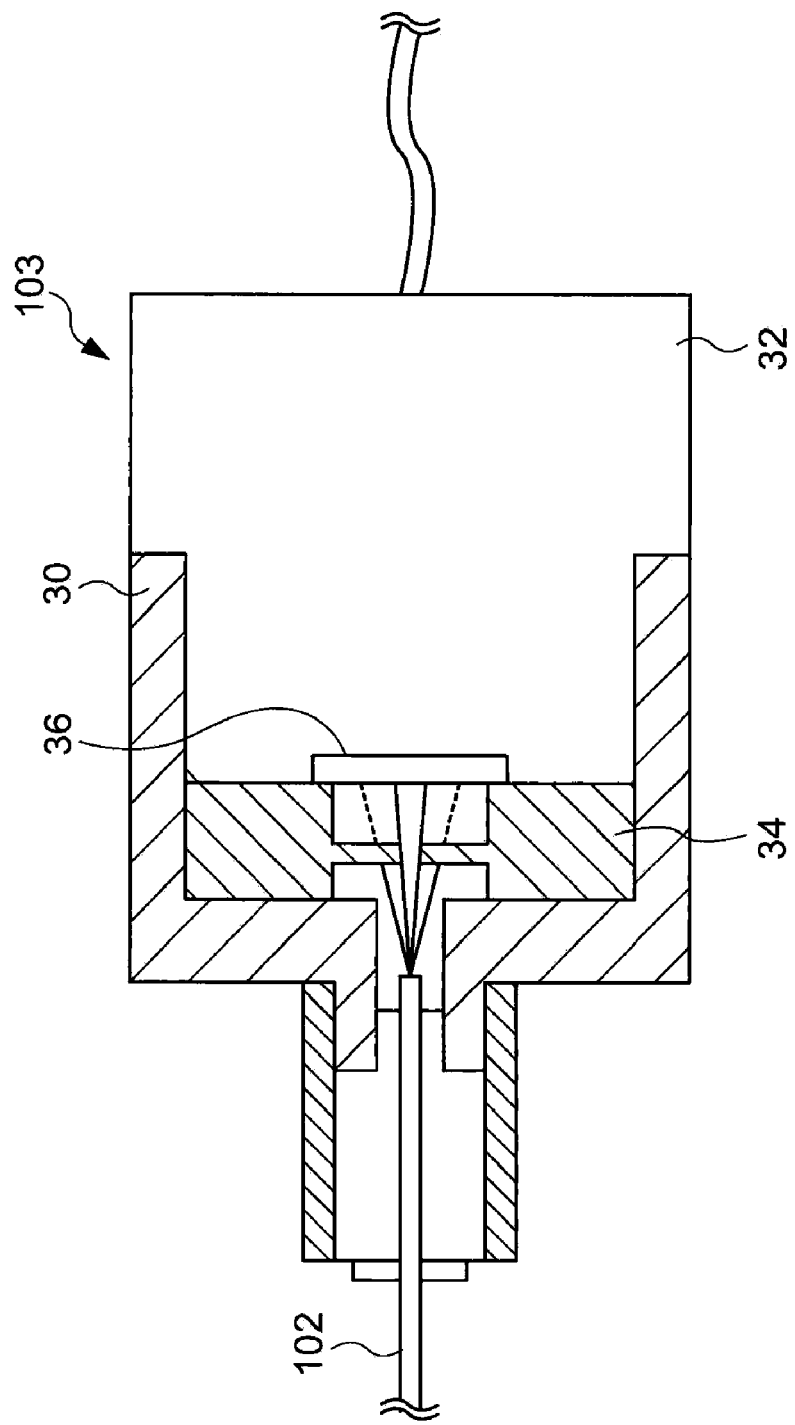
FIG. 3 is a cross-sectional view for describing the structure of a sensor unit in detail.

FIG. 3 is a cross-sectional view for describing the structure of the sensor unit in detail. The sensor unit 103 is equipped with an adapter section 30, a photodetector 32, and a diaphragm member 34. In the present example, a FC connector is mounted on the other end of the optical fiber 102, and the FC connector is attached to an end face of the sensor unit 103. The photodetector 32 is disposed on the side of the other end of the optical fiber 102, receives at a receiving surface 36 irradiated light emitted from the other end of the optical fiber 102, and outputs an electrical signal corresponding to the intensity of the received light. The diaphragm member 34 is disposed between the other end of the optical fiber 102 and the photodetector 32, and transmits a portion of components of the irradiated light near its optical axis emitted from the optical fiber 102.

Figure 4:
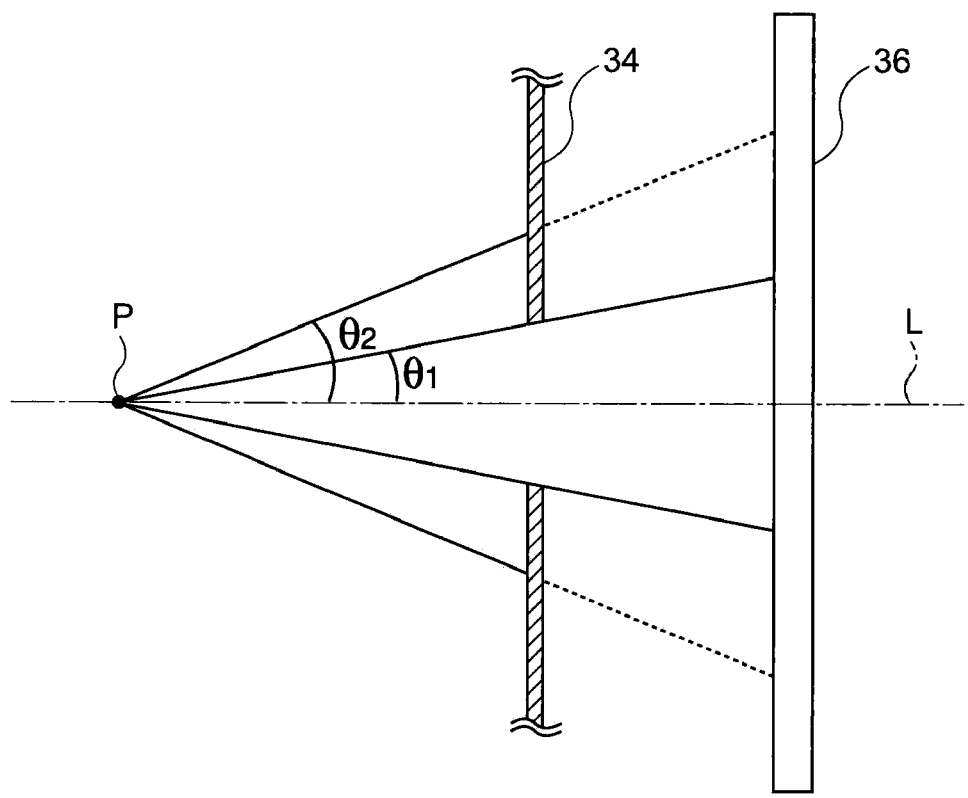
FIG. 4 is a view for describing a diaphragm member in detail.

FIG. 4 is a view for describing the diaphragm member in detail. FIG. 4 schematically shows a cross section that passes an optical axis L of emission light that is emitted from the other end of the optical fiber 102. The emission light emitted from the other end (a point of emission P) of the optical fiber 102 widens at an emission angle $\theta_2$ (for example, about 12 degrees) with respect to the optical axis L as a reference. In this instance, the diaphragm member 34 passes a portion of components of the emission light emitted from the optical fiber adjacent the optical axis L, more specifically, passes a component of the emission light at an emission angle $\theta_1$ (for example, about 4-8 degrees), and shields components at emission angles greater than the emission angle $\theta_1$ (peripheral components). As a result, a portion of components of the emission light having the emission angle $\theta_1$ enters the light receiving surface 36. The emission angle $\theta_1$ of a portion of components of the emission light to be passed through the diaphragm member 34 may be set by appropriately adjusting the aperture size of the opening of the diaphragm member 34, the mutual distance between the other end of the optical fiber 102 (the point of emission P) and the diaphragm member 34, and the like.

Figure 5:
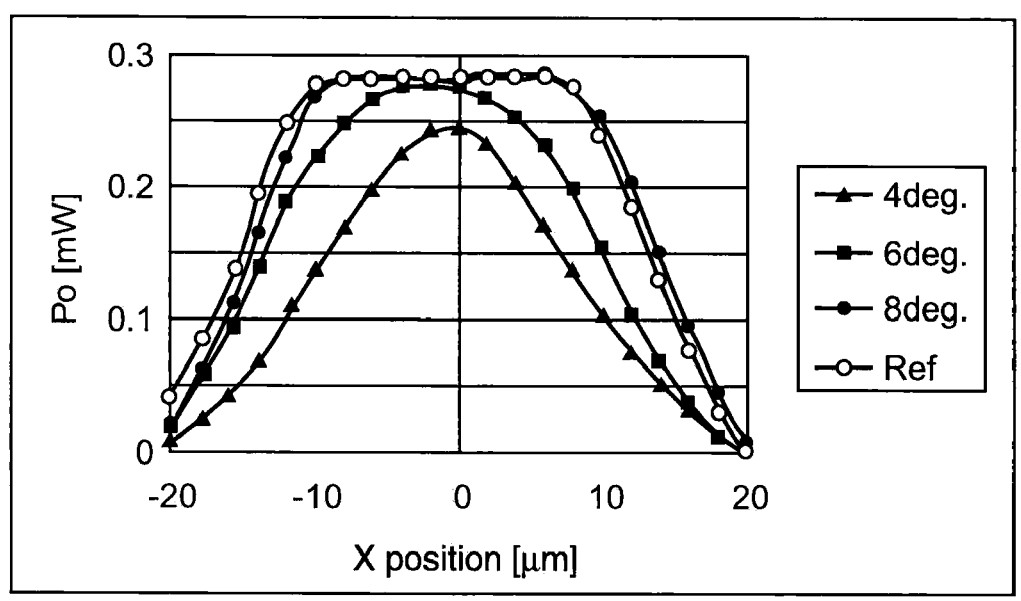
FIG. 5 shows an example of characteristic curves (tolerance curves) obtained through conducting detection of the amount of light.
Figure 6:
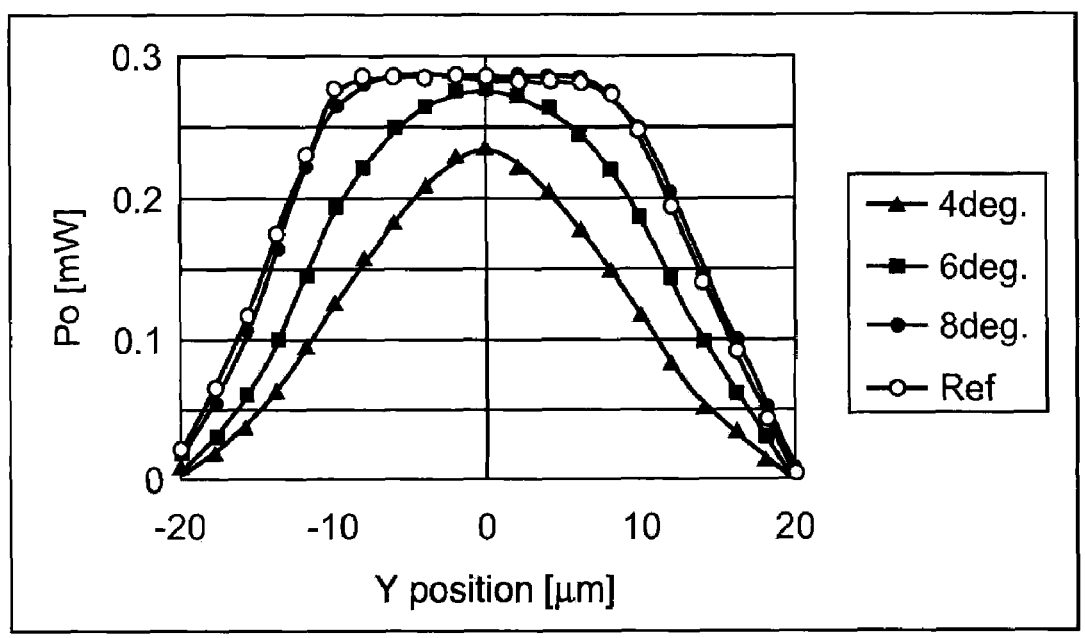
FIG. 6 shows an example of characteristic curves (tolerance curves) obtained through conducting detection of the amount of light.
Figure 7:
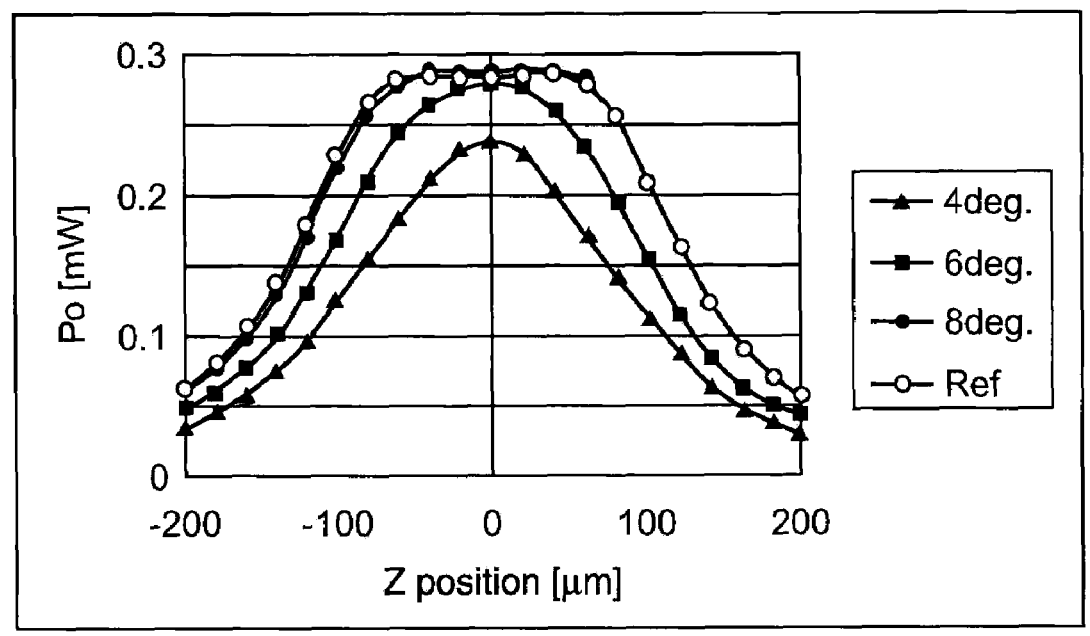
FIG. 7 shows an example of characteristic curves (tolerance curves) obtained through conducting detection of the amount of light.

FIGS. 5-7 are examples of characteristic curves (tolerance curves) obtained through detecting the amount of light emitted from the light emitting element 10 by using the photodetector 32a, while relatively moving positions of the can package 100 including the light emitting element 10 and the connector part 101 in X, Y and Z directions, respectively. More specifically, FIG. 5 shows tolerance curves obtained when the can package 100 (or the connector part 101) is moved in the X direction. FIG. 6 shows tolerance curves obtained when the can package 100 (or the connector part 101) is moved in the Y direction. FIG. 7 shows tolerance curves obtained when the can package 100 (or the connector part 101) is moved in the Z direction. Curves noted as "Ref" in FIGS. 5-7 indicate characteristic curves obtained when the entire emission light emitted from the optical fiber 102 is made incident upon the light receiving surface 36 of the photodetector 32 without intervening the diaphragm member 34. Curves noted as "4 deg.," "6 deg." and "8 deg." in FIGS. 5-7 indicate characteristic curves obtained when the diaphragm member 34 is intervened, and portions of components of the emission light corresponding to the emission angles $\theta_1$ being 4°, 6° and 8°, respectively, are passed through the diaphragm member 34 and made incident upon the light receiving surface of the photodetector 32. As shown in each of the figures, a shade is created by intervening the diaphragm member 34, such that only a portion of components of the emission light that is cut at an emission angle $\theta_1$ is detected, whereby a tolerance curve that is in a trapezoidal shape becomes narrower, and changes into a curve having a peak. At the time of manufacturing an optical module, the can package 100 and the connector part 101 are positioned with respect to each other based on the tolerance curve at relative positions where the amount of light indicates a peak, in other words, their optical axes are matched (or their cores are aligned) with each other, such that highly accurate positioning can be conducted in a short time with few differences.

Next, a method for manufacturing an optical module using the positioning apparatus described above is described.

First, the light emitting element 10 within the can package 100 is caused to emit light. While relatively moving the positions of the can package 100 and the connector part 101 by the moveable stage 105, the amount of light conducted through the optical fiber 102 is detected by the photodetector 32 provided within the sensor unit 103 (first step). The amount of light detected by the photodetector 32 is inputted as data to the measurement system 104.

The measurement system 104 calculates a position at which the amount of light detected by the photodetector 32 indicates a peak, and sends information indicative of the calculated position to the moveable stage 105 or a driving section (not illustrated) of the moveable stage 105.

Next, the can package 100 including the light emitting element 10 and the connector part 101 are affixed at relative positions (see FIGS. 5-7) at which the amount of light detected by the photodetector 32 indicates a peak (second step). The can package 100 and the connector part 101 are affixed to each other with, for example, ultraviolet-ray setting type adhesive (see FIG. 2).

It is noted that a coarse adjustment may be conducted initially without intervening the diaphragm member 34, and then a fine adjustment may be conducted with the diaphragm member 34, as follows.

Concretely, first, the light emitting element 10 is caused to emit light in a state in which the diaphragm member 34 is removed from the sensor unit 103 (in other words, removed from a light traveling path). Then, the amount of light is detected by the photodetector 32 while relatively moving the positions of the can package 100 and the connector part 101.

Next, the can package 100 and the connector part 101 are coarsely adjusted at positions at which the amount of light detected by the photodetector 32 exhibits a peak (second step). In this case, the tolerance curve is in a trapezoidal shape that is noted as "Ref" in FIGS. 5-7, and the core alignment accuracy is low, but the core alignment can be conducted in a short time as the amount of light in a greater absolute value can be secured.

Next, the diaphragm member 34 is attached to the sensor unit 103 (in other words, returned to the light traveling path), and the light emitting element 10 is caused to emit light. Then, the amount of light is detected by the photodetector 32 while relatively moving the positions of the can package 100 and the connector part 101 (third step).

Then, the can package 100 and the connector part 101 are adjusted to positions at which the amount of light detected by the photodetector 32 exhibits a peak (fourth step), and then they are affixed with each other (fifth step).

It is noted that two optical systems, one of the optical systems without the diaphragm member 34 being intervened, and the other with the diaphragm member 34 being intervened, may be provided, and a coarse adjustment may be initially conducted, and then a fine adjustment may be conducted, like the procedure described above.

Figure 8:
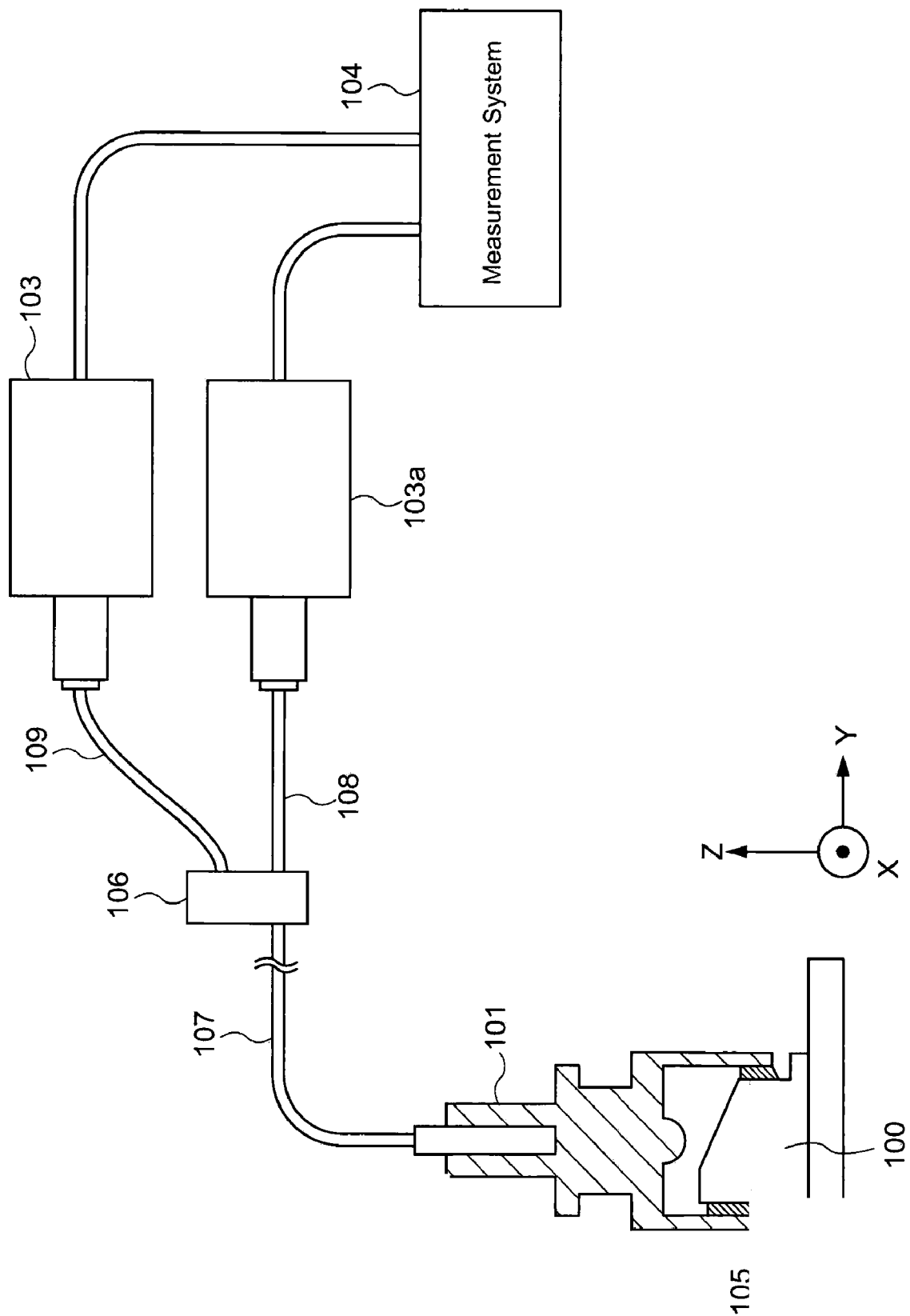
FIG. 8 is a block diagram for describing an example of the structure of a positioning apparatus in the case of providing two optical systems.

FIG. 8 is a block diagram of an example of the structure of a positioning apparatus when two optical systems are provided. The positioning apparatus shown in FIG. 8 performs positioning of the can package 100 and the connector part 101, and includes optical fibers 107, 108 and 109, sensor units 103 and 103a, a measurement system 104, a moveable stage 105, and an optical branch 106. By combining the optical fibers 107-109 and the optical branch 106, an "optical fiber equipped with a common one end and first and second other ends" is composed in accordance with an aspect of the embodiment of the invention. The optical fiber 107 has one end mounted on the connector part 101. The other end of the optical fiber 107 and one end of each of the optical fibers 108 and 109 are connected to the optical branch 106. The sensor unit 103a is disposed on the side of the other end (first other end) of the optical fiber 108. The sensor unit 103 is disposed on the side of the other end (second other end) of the optical fiber 109. Light emitted from the other end of the optical fiber 107 is branched by the optical branch 106, and enters the one ends of the respective optical fibers 108 and 109. The sensor unit 103 has the structure described in detail above (see FIG. 3), and the diaphragm member 34 is disposed between the other end of the optical fiber 109 and the photodetector 32 (second photodetector) included in the sensor unit 103. Also, the sensor unit 103a has a structure in which the diaphragm member 34 is omitted from the sensor unit 103.

Next, a method for manufacturing an optical module using the positioning apparatus shown in FIG. 8 is described.

First, the light emitting element 10 within the can package 100 is caused to emit light. While relatively moving the positions of the can package 100 and the connector part 101, the amount of light is detected by the photodetector 32 (first photodetector) provided within the sensor unit 103a (first step). The amount of light detected by the photodetector 32 is inputted as data to the measurement system 104.

Next, the can package 100 and the connector part 101 are roughly adjusted to positions at which the amount of light detected by the photodetector 32 within the sensor unit 103a exhibits a peak (second step).

The light emitting element 10 within the can package 100 is caused to emit light, and while relatively moving the positions of the can package 100 and the connector part 101, the amount of light is detected by the photodetector 32 (second photodetector) provided within the sensor unit 103 (third step).

Next, the can package 100 and the connector part 101 are adjusted to positions at which the amount of light detected by the photodetector 32 within the sensor unit 103 exhibits a peak (fourth step), and then they are affixed with each other (fifth step).

In this manner, according to the first embodiment, characteristics of the amount of light detected by the photodetector, in other words, tolerance curves can be changed from a trapezoidal shape to a shape having a clear peak, through including the diaphragm member. By conducting a core alignment based on the tolerance curve, highly accurate positioning with few differences can be conducted in a short time. Accordingly, a core alignment technology suitable for mass-production of optical modules can be obtained. Moreover, by conducting a coarse adjustment first by an optical system without a diaphragm member being intervened, and then conducting a fine adjustment by an optical system with a diaphragm member being intervened, the work hour can be further shortened. Accordingly, a core alignment technology suitable for mass-production of optical modules can be obtained.

1.2. Second Embodiment

In accordance with the first embodiment, peak characteristics are generated in tolerance curves by providing the diaphragm member before the photodetector. However, the diaphragm member may be disposed in the middle of an optical fiber.

Figure 9:
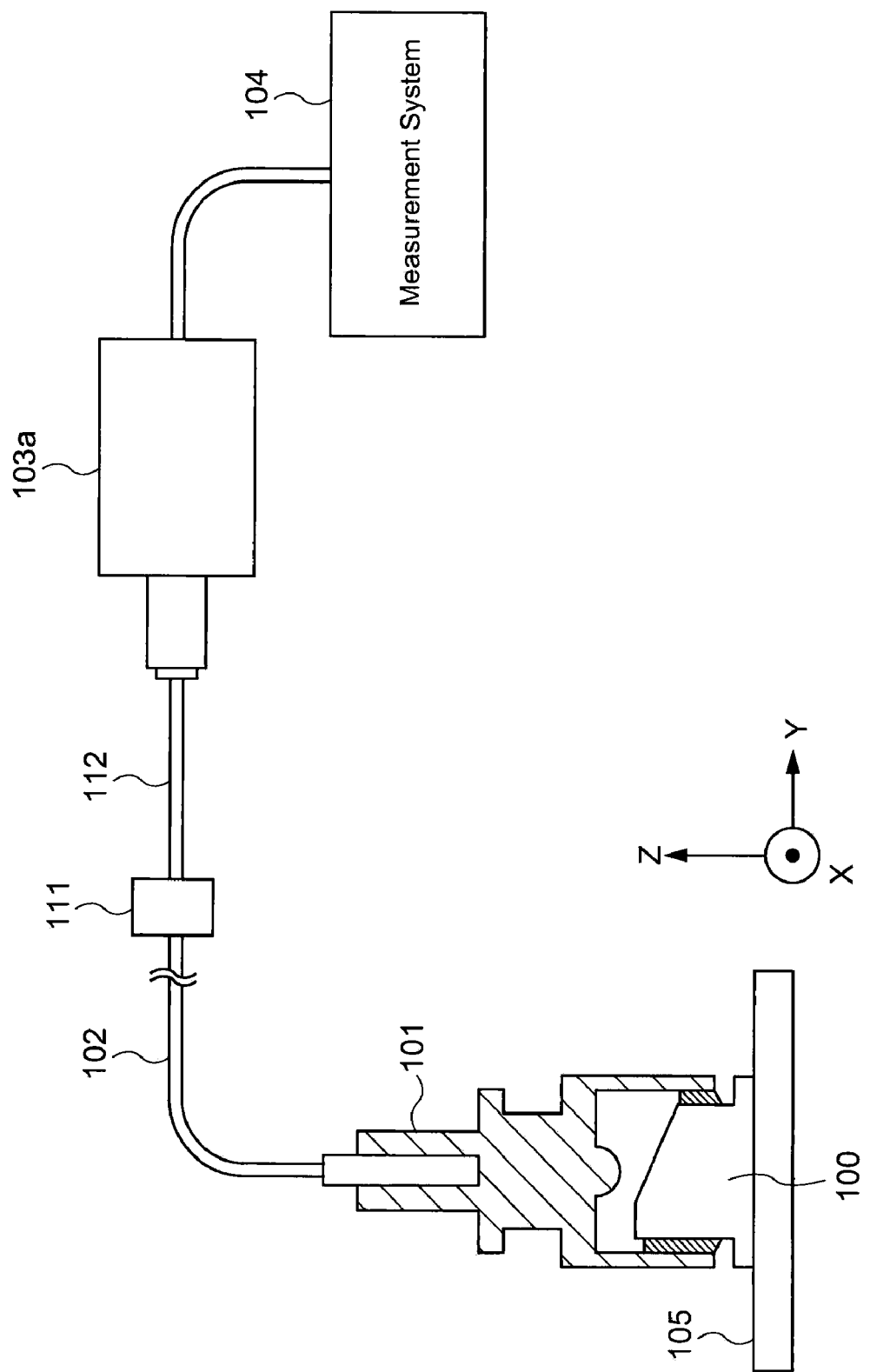
FIG. 9 is a schematic block diagram for describing the structure of an apparatus for manufacturing an optical module in accordance with a second embodiment of the invention.

FIG. 9 is a schematic block diagram for describing the structure of an apparatus for manufacturing an optical module in accordance with a second embodiment of the invention. The positioning apparatus shown in FIG. 9 is an apparatus for positioning a can package 100 and a connector part 101, and has a structure equipped with optical fibers 102 and 112, a sensor unit 103a, a measurement system 104, a moveable stage 105, and an optical coupler 111.

The optical fiber 102 (first optical fiber) has one end mounted on the connector part 101. It is noted here that the optical fiber 102 may be, for example, a GI (Graded Index) multimode fiber with an NA being 0.21, having a core diameter of 50 μm and a clad diameter of 125 μm.

The optical fiber 112 (second optical fiber) has one end optically coupled to the other end of the optical fiber 102 by the optical coupler 111. It is noted here that the optical fiber 112 may be, for example, a GI (Graded Index) multimode fiber with an NA being 0.21, having a core diameter of 50 μm and a clad diameter of 125 μm.

The sensor unit 103a has a structure wherein the diaphragm member 34 is omitted from the sensor unit 103 (see FIG. 3) described above, and is equipped with a photodetector 32 disposed on the side of the other end of the optical fiber 112.

Figure 10:
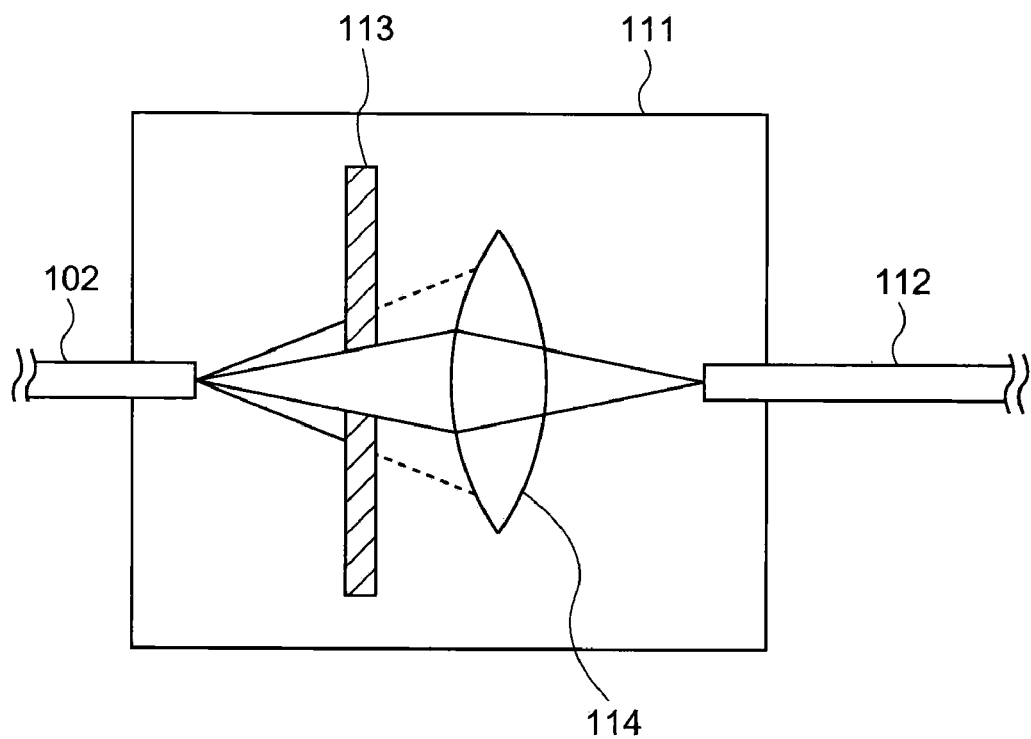
FIG. 10 is a view for describing an example of the structure of an optical coupler.

FIG. 10 is a view for describing an example of the structure of the optical coupler. The optical coupler 111 shown in FIG. 10 aligns optical axes of the optical fiber 102 and the optical fiber 112 with each other, and connects them, and is composed of a diaphragm member 113 and a condensing lens 114. The diaphragm member 113 is disposed between the other end of the optical fiber 102 and the one end of the optical fiber 112, and passes a portion of components of emission light emitted from the optical fiber 102 adjacent its optical axis. The detail of the diaphragm member 113 is the same as that of the first embodiment described above (see FIG. 4). The condensing lens 114 is disposed between the diaphragm member 113 and the optical fiber 112. It is noted that the condensing lens 114 may be disposed between the optical fiber 102 and the diaphragm member 113.

Figure 11:
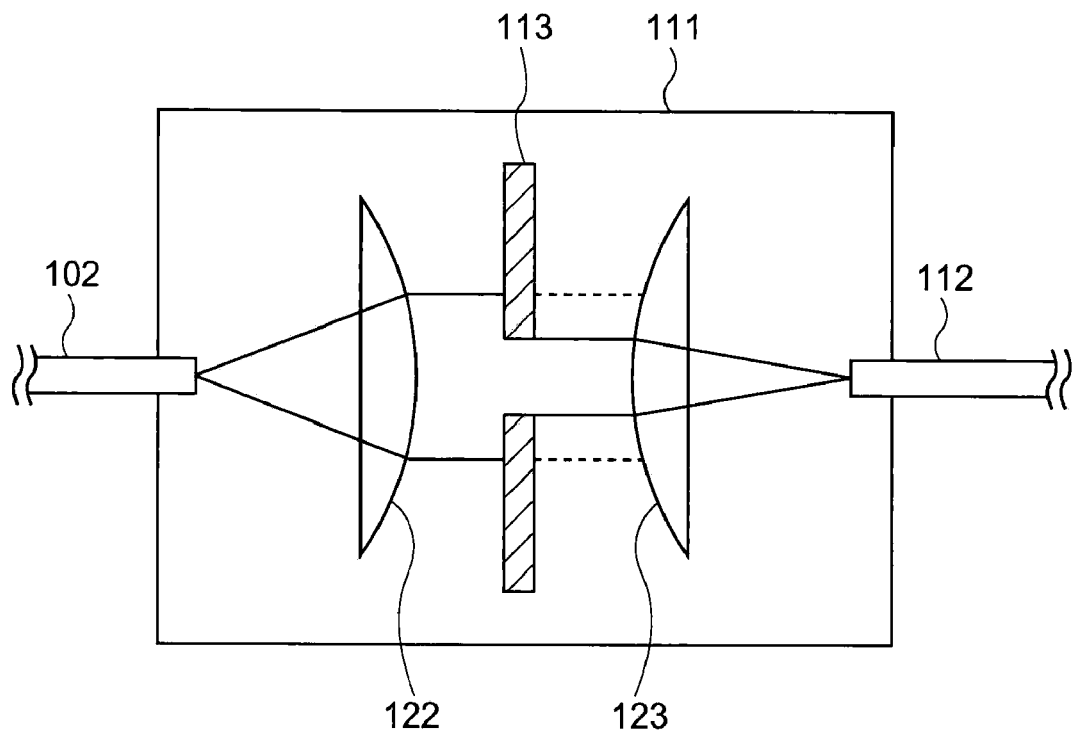
FIG. 11 is a view for describing another example of the structure of an optical coupler.

FIG. 11 is a view for describing another exemplary structure of the optical coupler. The optical coupler 111 shown in FIG. 11 has a structure including a diaphragm member 113, and a pair of collimate lenses 122 and 123. The collimate lens 122 is disposed between the optical fiber 102 and the optical fiber 112 on the side of the optical fiber 102. The collimate lens 123 is disposed between the optical fiber 102 and the optical fiber 112 on the side of the optical fiber 112. The diaphragm member 113 is disposed between the collimate lenses 122 and 123, and passes a portion of components of generally parallel light passing between the collimate lenses 122 and 123 adjacent its optical axis.

By using the optical coupler 111 having the structure shown in FIG. 10 or FIG. 11 described above, peaks of tolerance curves can be made conspicuous. A method for manufacturing an optical module using the positioning apparatus having such a structure as described above is generally the same as that of the first embodiment, and therefore its description is omitted.

It is noted that two optical systems, one of the optical systems without a diaphragm member 34 being intervened and the other with a diaphragm member 34 being intervened, may be provided, and a coarse adjustment may be conducted first, and then a fine adjustment may be conducted, like the embodiment described above.

Figure 12:
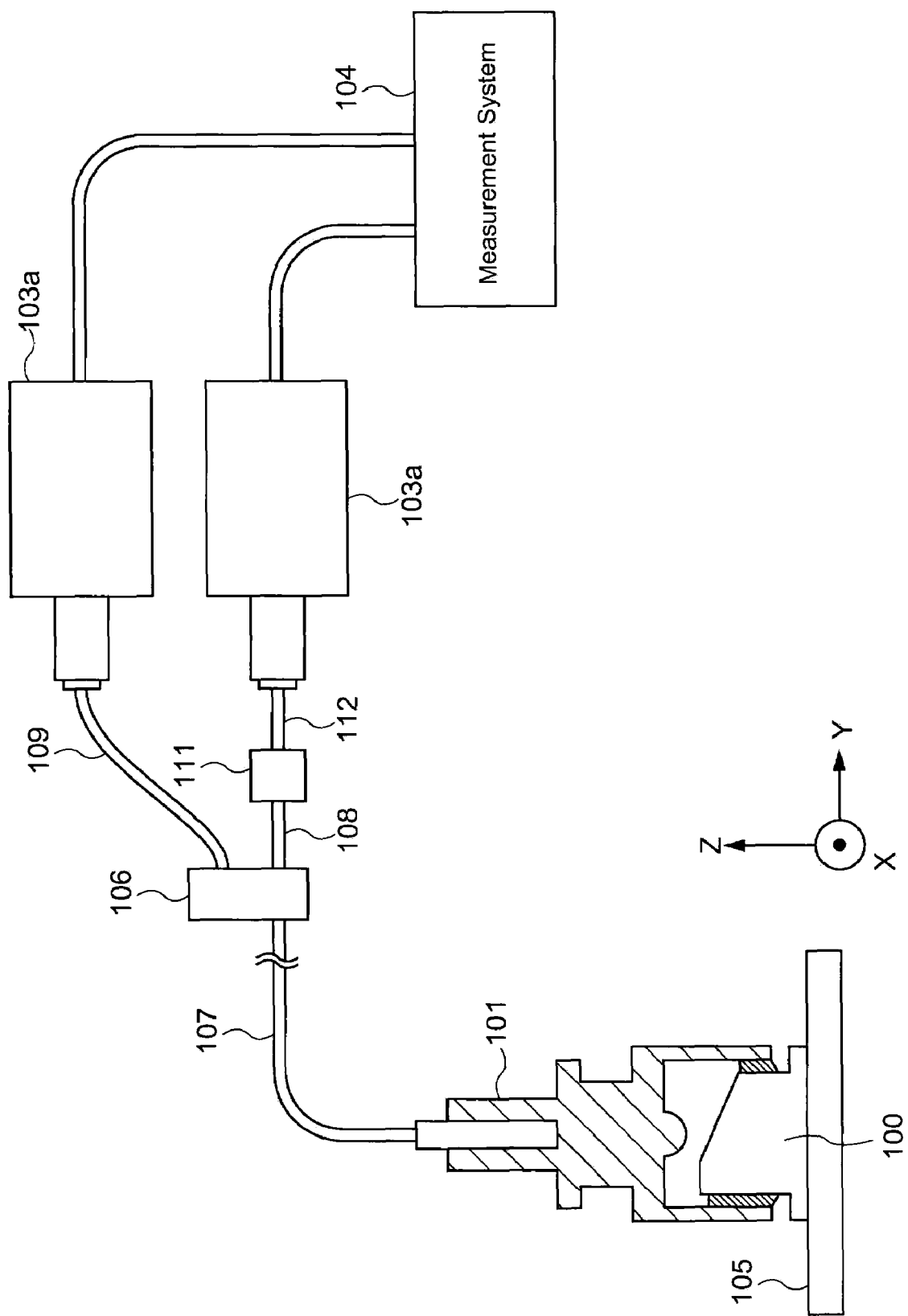
FIG. 12 is a block diagram for describing an example of the structure of a positioning apparatus in the case of providing two optical systems.

FIG. 12 is a block diagram of an example of the structure of a positioning apparatus when two optical systems are provided. The positioning apparatus shown in FIG. 12 performs positioning of the can package 100 and the connector part 101, and includes optical fibers 107, 108, 109 and 112, two sensor units 103a, a measurement system 104, a moveable stage 105, an optical branch 106, and an optical coupler 111. By combining the optical fibers 107-109 and the optical branch 106, an "optical fiber equipped with a common one end and first and second other ends" is composed in accordance with an aspect of the embodiment of the invention. The optical fiber 107 has one end mounted on the connector part 101. The other end of the optical fiber 107 and one end of each of the optical fibers 108 and 109 are connected to the optical branch 106. The other end (first other end) of the optical fiber 108 is connected to the optical fiber 112 through the optical coupler 111. The sensor units 103a are disposed on the side of the other ends of the respective optical fibers 109 and 112. The structure of the sensor unit 103a is the same as that described in detail above. Light emitted from the other end of the optical fiber 107 is branched, and enters the one ends of the respective optical fibers 108 and 109.

A method for manufacturing an optical module using the positioning apparatus having the structure shown in FIG. 12 described above is similar to that of the first embodiment, and therefore its description is omitted.

With the structure described above, peak characteristics of tolerance curves observed by the sensor unit 103 can be made conspicuous.

1.3. Third Embodiment

In accordance with the first and second embodiments, peak characteristics are caused on tolerance curves by providing a diaphragm member. However, similar effects can also be obtained by combining optical fibers having different core diameters.

Figure 13:
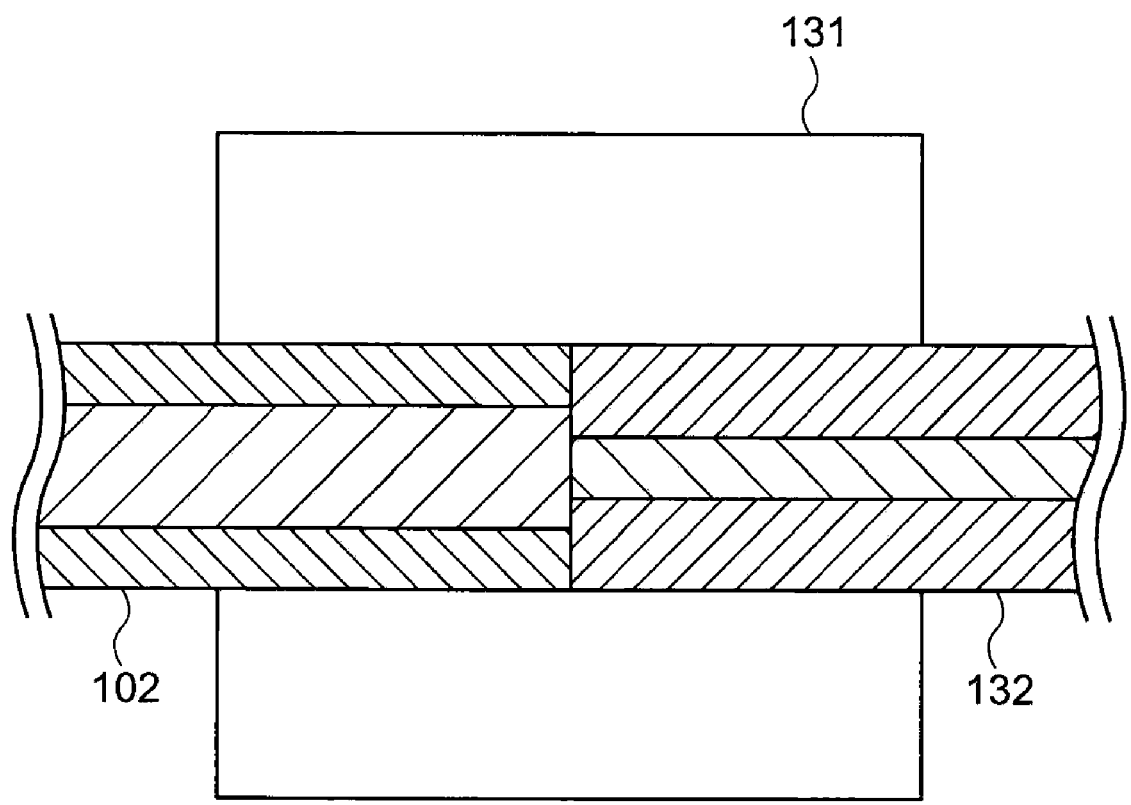
FIG. 13 is a view for describing an example of the structure of a positioning apparatus in accordance with a third embodiment of the invention.

FIG. 13 is a view for describing an exemplary structure of a positioning apparatus in accordance with a third embodiment of the invention. It is noted that the overall structure of the positioning apparatus in accordance with the third embodiment is substantially the same as that of the second embodiment (see FIG. 9 and FIG. 12), but the structure of an optical coupler used in this embodiment and the relation of core diameters of optical fibers are changed. For this reason, illustration of the overall structure is omitted. As shown in FIG. 13, an optical coupler 131 in accordance with the third embodiment directly, optically couples two optical fibers 102 and 132. The optical fiber 102 has one end mounted on a connector part of the optical module in a manner described above. The optical fiber 132 has one end that is optically connected to the optical fiber 102 by the optical coupler 131, and the other end connected to a sensor unit 103a. As illustrate, the optical fiber 132 has a smaller core diameter than that of the optical fiber 102. For example, when the core diameter of the optical fiber 102 is 50 µm, the core diameter of the optical fiber 132 is set to about 20-40 µm. The core characteristic of each of the optical fibers may be either a refractive index distribution (GI: Graded Index) type or a refractive index step (SI: Step Index) type.

In this manner, the size relation in core diameters may be used to generate a shade to light that enters the optical fiber 132, whereby peak characteristics of tolerance curves observed by the sensor unit 103a can be made conspicuous.

1.4. Fourth Embodiment

Furthermore, as described below, peak characteristics can be generated in tolerance curves by setting the size of the light receiving surface of a photodetector smaller than the spot size of emission light emitted from an optical fiber.

Figure 14:
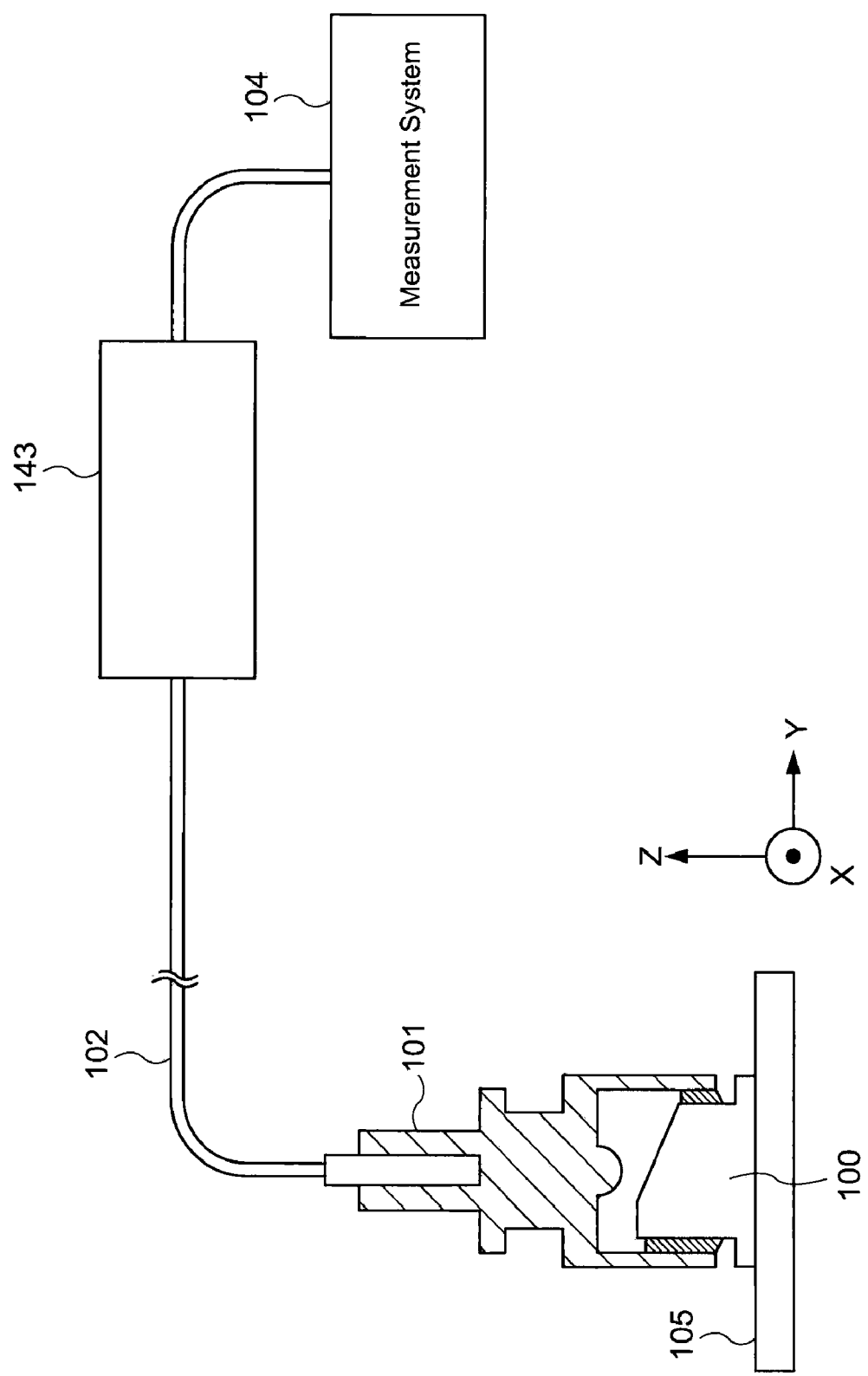
FIG. 14 is a schematic block diagram for describing the structure of an apparatus for manufacturing an optical module in accordance with a fourth embodiment of the invention.

FIG. 14 is a schematic block diagram for describing the structure of an apparatus for manufacturing an optical module in accordance with a fourth embodiment of the invention. A positioning apparatus shown in FIG. 14 is provided to position a can package 100 and a connector part 101 with respect to each other, and is equipped with an optical fiber 102 having one end mounted on the connector part 101, a sensor unit 143, a measurement system 104, and a moveable stage 105. Details of the structure of each of the components other than the sensor unit 143 are generally the same as those of the embodiments described above.

Figure 15:
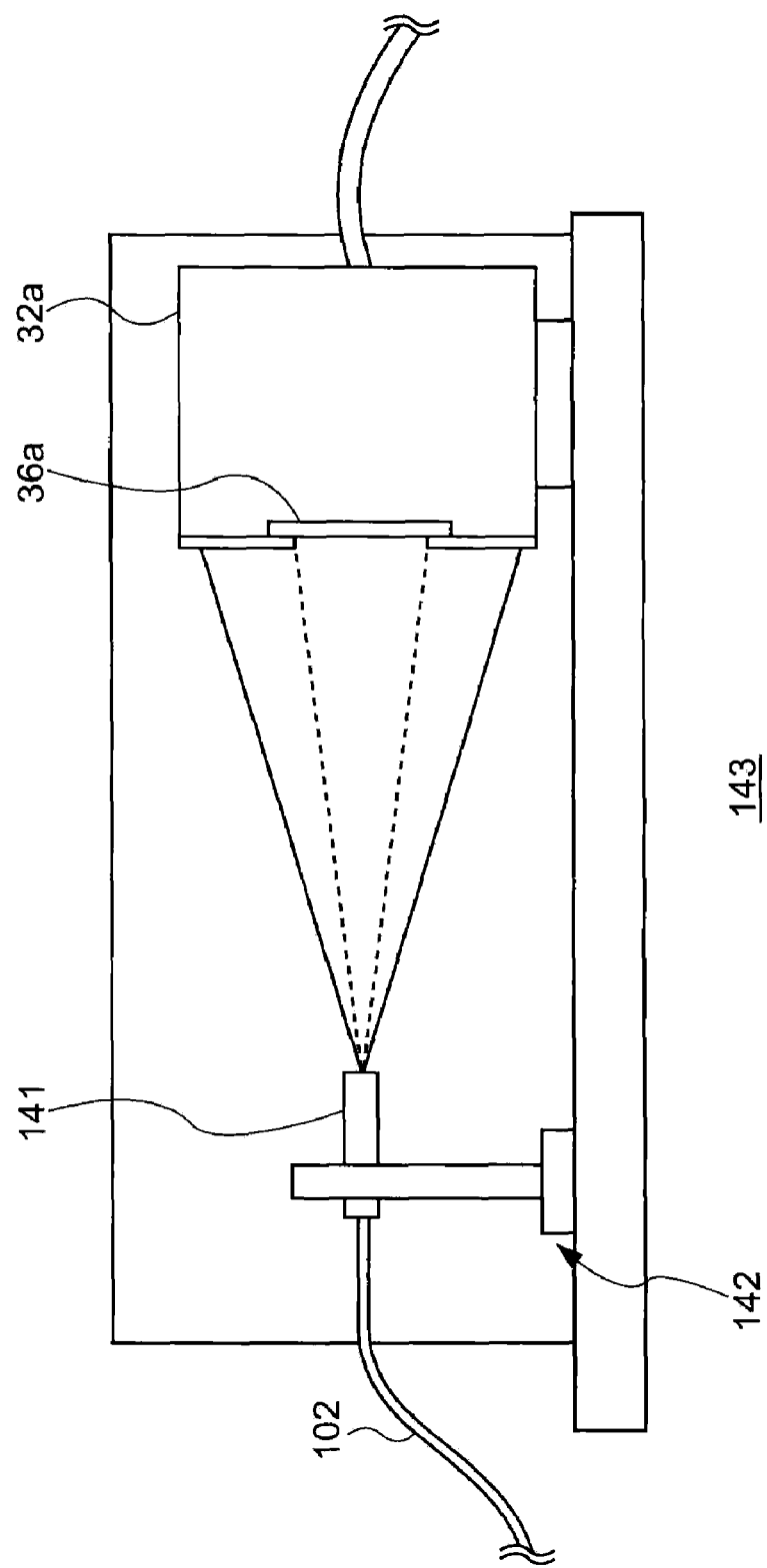
FIG. 15 is a block diagram for describing a sensor unit in detail in accordance with the fourth embodiment.

FIG. 15 is a view for describing a sensor unit in detail in accordance with the fourth embodiment. The sensor unit 143 shown in FIG. 15 is equipped with a ferule 141 attached to the other end of the optical fiber 102, a supporting member 142 that supports the ferule 141, and a photodetector 32a spaced at a predetermined distance from the other end of the optical fiber 102.

Figure 16:
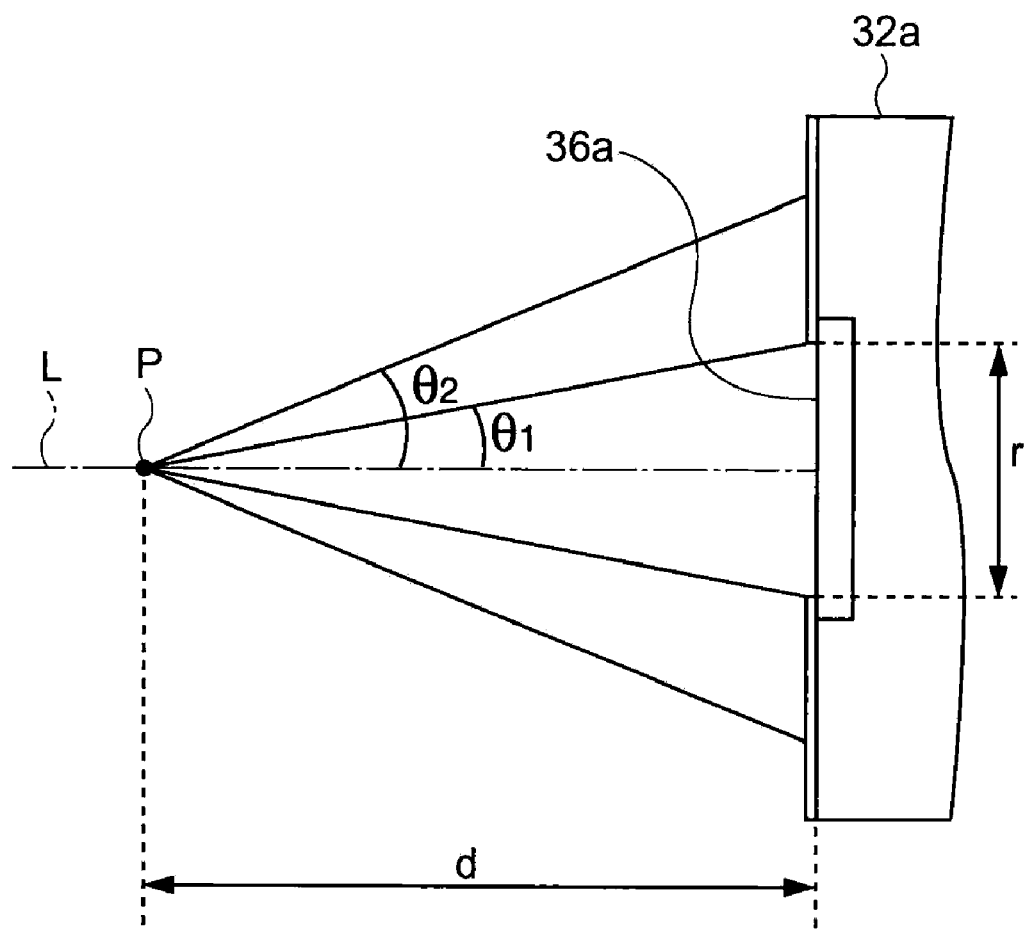
FIG. 16 is a view for describing the mutual distance between a photodetector and an optical fiber.

FIG. 16 is a view for describing the mutual distance between the photodetector and the optical fiber. FIG. 16 schematically shows a cross section of emission light passing an optical axis L thereof, emitted from the other end of the optical fiber 102. The photodetector 32a is disposed at an appropriate distance from the optical fiber 102 such that the light receiving surface 36a becomes relatively smaller than the spot size of emission light emitted from the other end of the optical fiber 102, and therefore a portion of components of the emission light adjacent to the optical axis L is incident upon the light receiving surface 36a. More concretely, the emission light emitted from the other end (a point of emission P) of the optical fiber 102 widens at an emission angle $\theta_2$ (for example, about 12 degrees) with respect to the optical axis L as a reference. In this instance, the distance d between the other end of the optical fiber 102 and the light receiving surface 36a of the photodetector 32a is set according to Formula (1) below such that only a portion of components of the emission light having an emission angle $\theta_1$ (for example, about 4-8 degrees) is incident upon the light receiving surface 36*a*. In this exemplary embodiment, the light receiving surface 36*a* is circular, and its diameter is r.

$$d = r/2 \tan \theta_1 \tag{1}$$

Accordingly, by setting the distance d at a value of $r/2 \tan \theta_1$ or greater, peaks in tolerance curves can be made conspicuous. For example, when the diameter r of the light receiving surface 36*a* is 13 mm, the distance d at which a portion of components of the emission light at an emission angle $\theta_1$ of 4 degrees is incident upon the light receiving surface 36*a* is about 93 mm. Similarly, the distance d at which a portion of components of the emission light at an emission angle $\theta_1$ of 6 degrees is incident upon the light receiving surface 36*a* is about 62 mm. Similarly, the distance d at which a portion of components of the emission light at an emission angle $\theta_1$ of 8 degrees is incident upon the light receiving surface 36*a* is about 46 mm. It is noted that a method for manufacturing an optical module using the positioning apparatus having the structure shown in FIG. 14 described above is substantially the same as that of the first embodiment, and therefore its description is omitted.

Also, two optical systems may be provided like the embodiments described above, whereby a coarse adjustment may be conducted first, and then a fine adjustment may be conducted.

Figure 17:
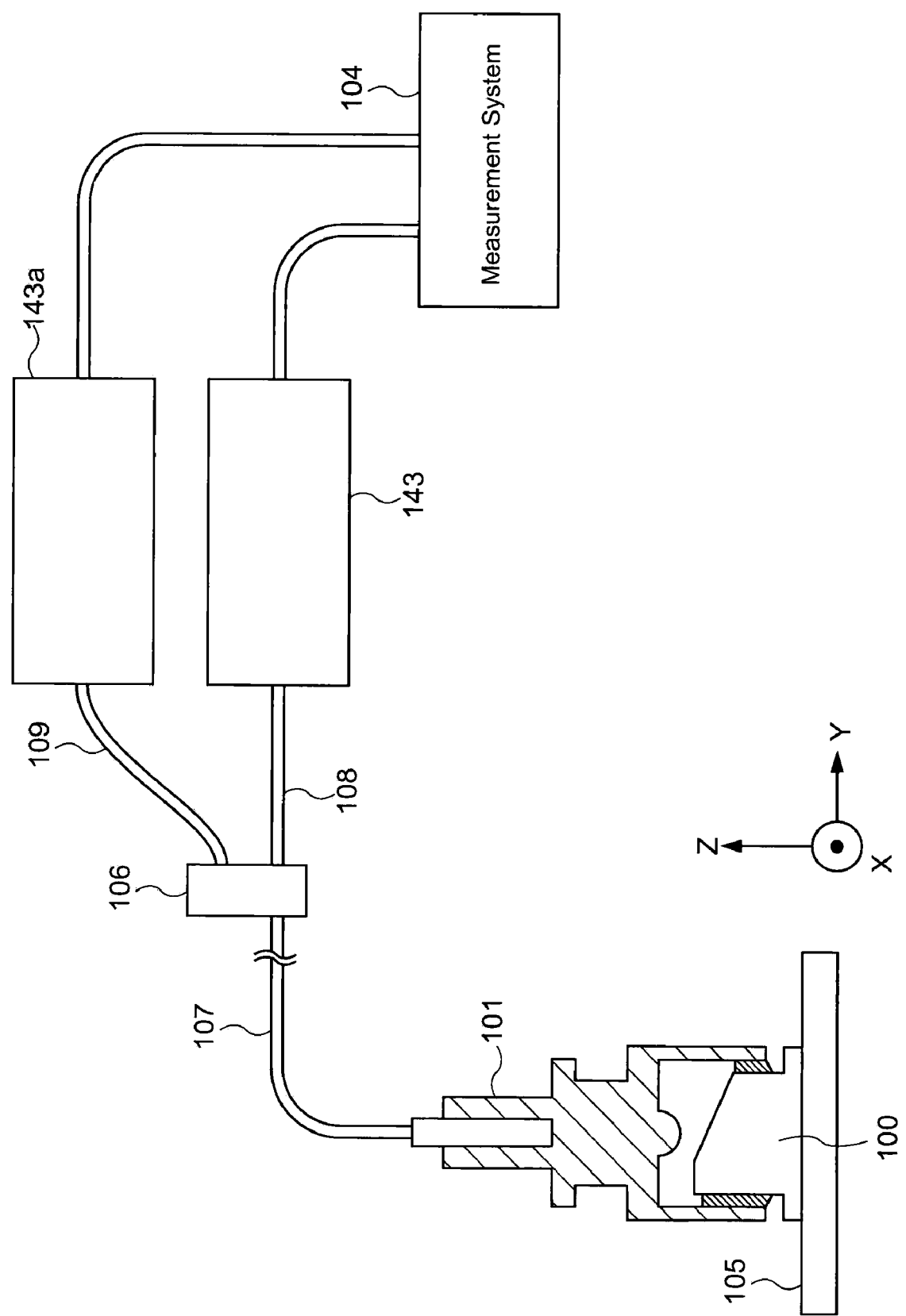
FIG. 17 is a block diagram for describing an example of the structure of a positioning apparatus in the case of providing two optical systems.

FIG. 17 is a block diagram for describing an example of the structure of a positioning apparatus in the case of providing two optical systems. The positioning apparatus shown in FIG. 17 performs positioning of the can package 100 and the connector part 101 with respect to each other, and includes optical fibers 107, 108 and 109, sensor units 143 and 143*a*, a measurement system 104, a moveable stage 105, and an optical branch 106. The optical fiber 107 has one end mounted on the connector part 101. The other end of the optical fiber 107 and one end of each of the optical fibers 108 and 109 are connected to the optical branch 106. Light emitted from the other end of the optical fiber 107 is branched by the optical branch 106, and enters the one ends of the respective optical fibers 108 and 109. By combining the optical fibers 107-109 and the optical branch 106, an "optical fiber equipped with a common one end and first and second other ends" is composed in accordance with an aspect of the embodiment of the invention. The sensor units 143 and 143*a* are disposed on the side of the other ends of the optical fibers 108 and 109, respectively. The sensor unit 143 has the structure described in detail above. Also, the sensor unit 143*a* has a structure similar to that of the sensor unit 143, wherein the mutual distance d between the other end of the optical fiber 109 and the photodetector 32*a* is made shorter such that the entire components of the emission light emitted from the optical fiber 109 (components corresponding to an emission angle $\theta_2$ in the illustration) is incident upon the light receiving surface 36*a*. For example, when the diameter r of the light receiving surface 36*a* is 13 mm, the mutual distance d between the other end of the optical fiber 109 and the photodetector 32*a* is 16 mm. A method for manufacturing an optical module using the positioning apparatus having the structure shown in FIG. 17 described above is substantially the same as that of the first embodiment, and therefore its description is omitted.

In this manner, the relation in size between a spot of emission light and a light receiving surface may be used to generate a shade to light that enters the optical fiber 32*a*, whereby peak characteristics of tolerance curves observed by the sensor unit 143 can be made conspicuous.

2. Method and Apparatus for Evaluating Optical Module

2.1. Fifth Embodiment

Figure 18:
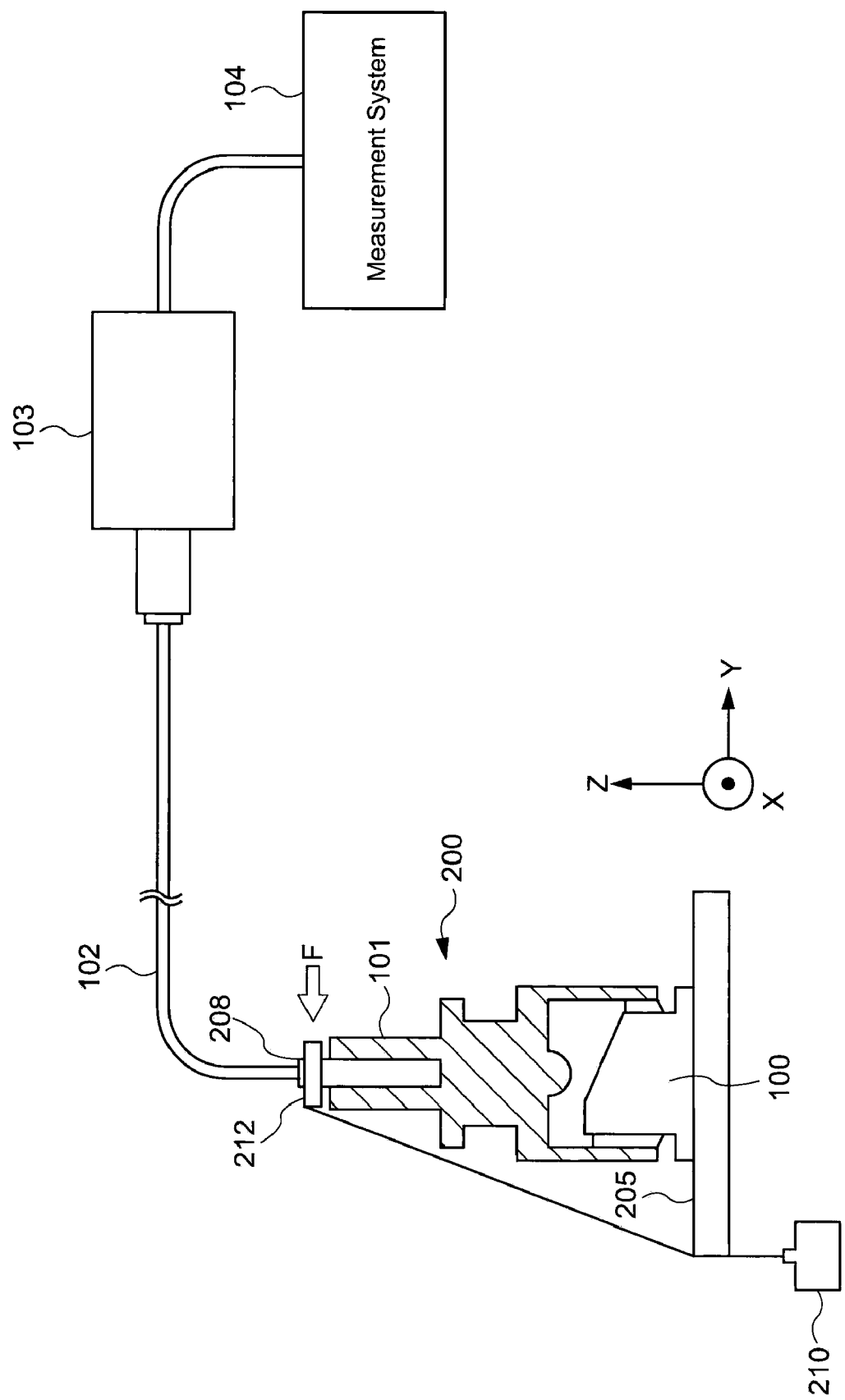
FIG. 18 is a schematic block diagram for describing the structure of an evaluation apparatus for evaluating an optical module in accordance with a fifth embodiment of the invention.

FIG. 18 is a schematic block diagram for describing the structure of an evaluation apparatus for evaluating an optical module in accordance with a fifth embodiment of the invention. The evaluation apparatus shown in FIG. 18 is an apparatus for evaluating relative positions of an light emitting element included in an optical module 200 and a connector part (a supporting member) 101. The evaluation apparatus includes an optical fiber 102, a sensor unit 103, a measurement system 104, a fixing member 205, and a pressure application device 212.

Figure 19:
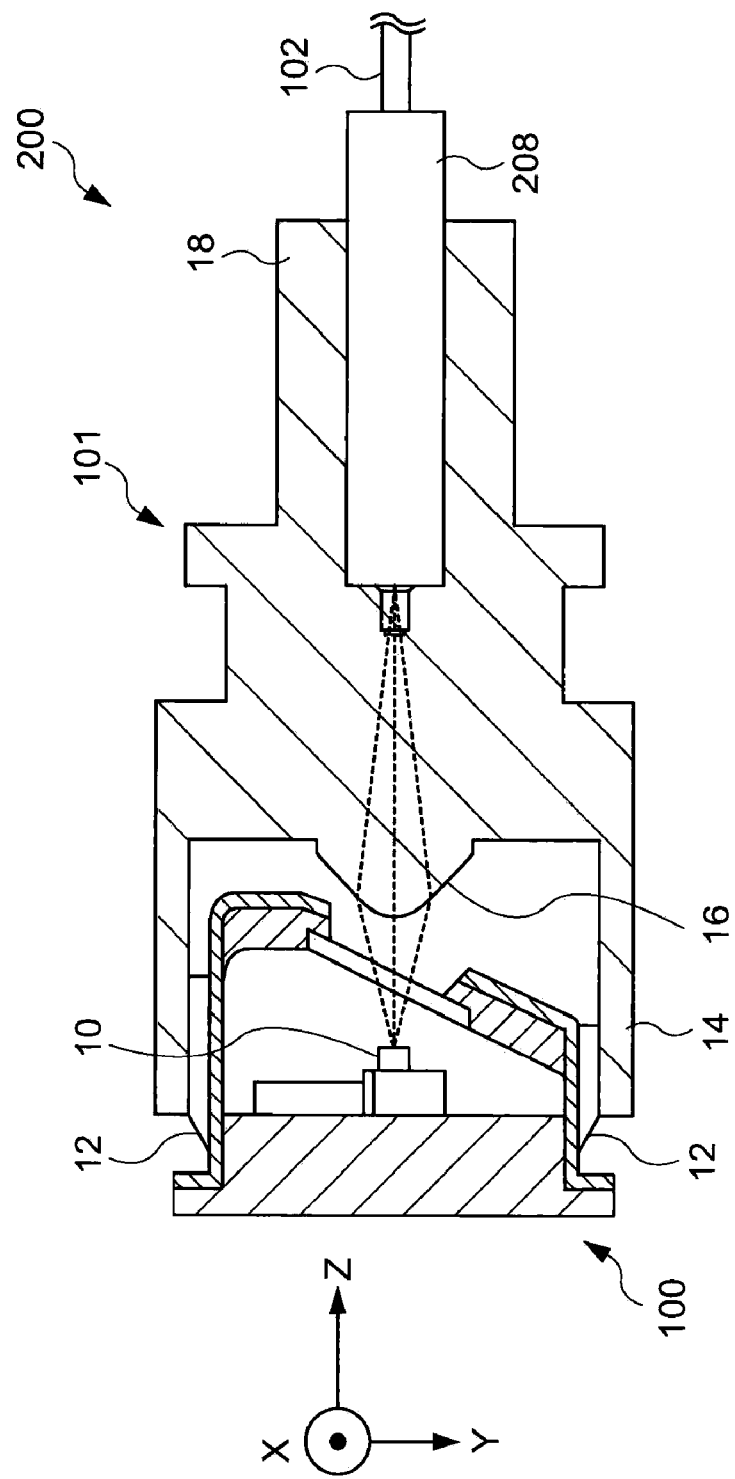
FIG. 19 is a cross-sectional view for describing the structure of an optical module in detail

FIG. 19 is a cross-sectional view for describing the structure of an optical module 200 in detail shown in FIG. 18. The optical module 200 in accordance with the present embodiment has a can package 100 and a connector part 101. The can package 100 includes a light emitting element 10 that is packaged within a container housing composed of metal or the like. The light emitting element 10 is, for example, a VCSEL (vertical cavity surface emitting diode) that emits light in a multimode oscillation.

The connector part 101 is equipped with a bore-like supporting section 14 that supports the can package 100, a lens section 16 that is disposed in alignment with an optical axis of the light emitting element 10, focuses light emitted from the light emitting element 10 and leads the light to one end of the optical fiber 102, and a sleeve section 18 with one end of the optical fiber 102 mounted thereon and supports the optical fiber 102. In the present example, a ferule 208 is mounted on one end of the optical fiber 102, and the ferule 208 is inserted in the sleeve section 18. It is noted that the optical fiber 102 (an optical fiber for evaluation) may be similar to an optical fiber for communications, and may be, for example, a GI (graded index) multimode fiber with an NA being 0.21, having a core diameter of 50 μm and a clad diameter of 125 μm.

The fixing member 205 fixes the optical module 200 so that the position of the light emitting element 10 of the optical module 200 does not move.

The pressure application device 212 applies a force F to the ferule 208 or the optical fiber 102, to thereby move the position of one end of the optical fiber 102. The position of one end of the optical fiber 102 can be moved, for example, in a direction perpendicular to the optical axis, in other words, x-direction or y-direction in FIG. 18. The pressure application device 212 in accordance with the present embodiment may be achieved by a weight 210 that is attached to the ferule 208, whereby a force F can be applied to the ferule 208 or the optical fiber 102. The weight, attachment direction and attachment position of the weight 210 may be changed to change the direction and magnitude of the force F to be applied to the optical fiber 102.

Details of the sensor unit 103 and the diaphragm member 34 included in the sensor unit 103 are generally the same as those of the sensor unit 103 in accordance with the first embodiment described above, and therefore their description is omitted.

Figure 20:
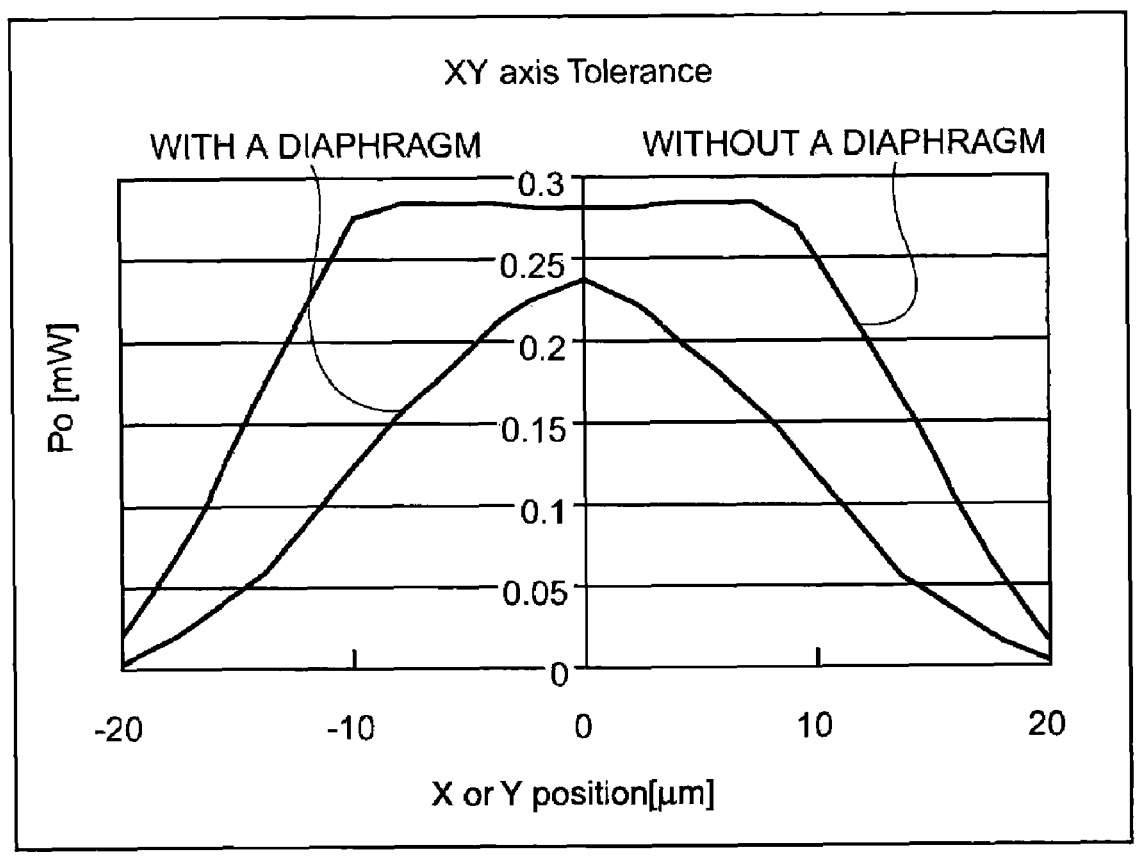
FIG. 20 is an example of characteristic curves (tolerance curves) obtained through conducting detection of the amount of light.

FIG. 20 shows an example of characteristic curves (tolerance curves) obtained through detecting the amount of light emitted from the light emitting element 10 by using the photodetector 32, while moving the position of one end of the optical fiber 102 by the pressure application device 212,.

More concretely, FIG. 20 shows a characteristic curve obtained when the entire emission light emitted from the optical fiber 102 is made incident upon the light receiving surface 36 of the photodetector 32 without intervening the diaphragm member 34, and a characteristic curve obtained when a portion of components of the emission light is passed by using the diaphragm member 34 and is made incident upon the light receiving surface 36 of the photodetector 32.

As shown in FIG. 20, a shade is created by intervening the diaphragm member 34, such that only a portion of components of the emission light that is cut at an emission angle $\theta_1$ is detected, whereby a tolerance curve that is in a trapezoidal shape becomes narrower, and changes into a curve having a peak.

The measurement system 104 evaluates relative positions of the light emitting element 10 and the optical fiber 102 based on the amount of light detected by the sensor unit 103. For example, the measurement system 104 is capable of creating a tolerance curve based on the amount of light detected by the sensor unit 103, and evaluating the optical module 200 based on the created tolerance curve. The measurement system 104 can obtain a tolerance curve through detecting the amount of light at each of the positions of one end of the optical fiber 102.

More specifically, the measurement system 104 is capable of judging based on a tolerance curve as to whether a peak that is the maximum value of the amount of light is obtained at a position (x=0, y=0) where the pressure application device 212 does not apply a force F to the ferule 208 or the optical fiber 102. When the peak position is not at the position (x=0, y=0), the measurement system 104 calculates the distance between the peak position and the position (x=0, y=0), thereby evaluating an axial difference.

In this manner, because the evaluation apparatus in accordance with the present embodiment is provided with the diaphragm member 34, a peak in a tolerance curve becomes conspicuous, and therefore an axial difference of the optical module 200 can be accurately evaluated.

Next, a method for evaluating an optical module using the evaluation apparatus described above is described.

First, an optical module 200 is affixed to the fixing member 205. Then, a ferule 208 that is attached to one end of the optical fiber 102 is mounted on the connector part 101.

Next, while causing the light emitting element 10 within the optical module 200 to emit light, the position of one end of the optical fiber 102 is moved. The evaluation apparatus in accordance with the present embodiment uses the pressure application device 212 to apply a force F to the ferule 208, to thereby move the position of the one end of the optical fiber 102. Then, the amount of light conducted through the optical fiber 102 is detected by the photodetector 32 within the sensor unit 103 at each of the positions of the one end of the optical fiber 102. The amount of light detected by the photodetector 32 is sequentially taken as data in the measurement system 104.

Next, the measurement system 104 evaluates relative positions of the light emitting element 10 and the optical fiber 102, in other words, relative positions of the light emitting element 10 and the connector part 101 based on the amount of light detected by the photodetector 32.

It is noted that two optical systems, one of the optical systems without the diaphragm member 34 intervened and the other with the diaphragm member 34 intervened, may be provided; and the optical module 200 may be evaluated as described above, and also the optical module 200 may be evaluated without the diaphragm member 34 being intervened, as described below.

Figure 21:
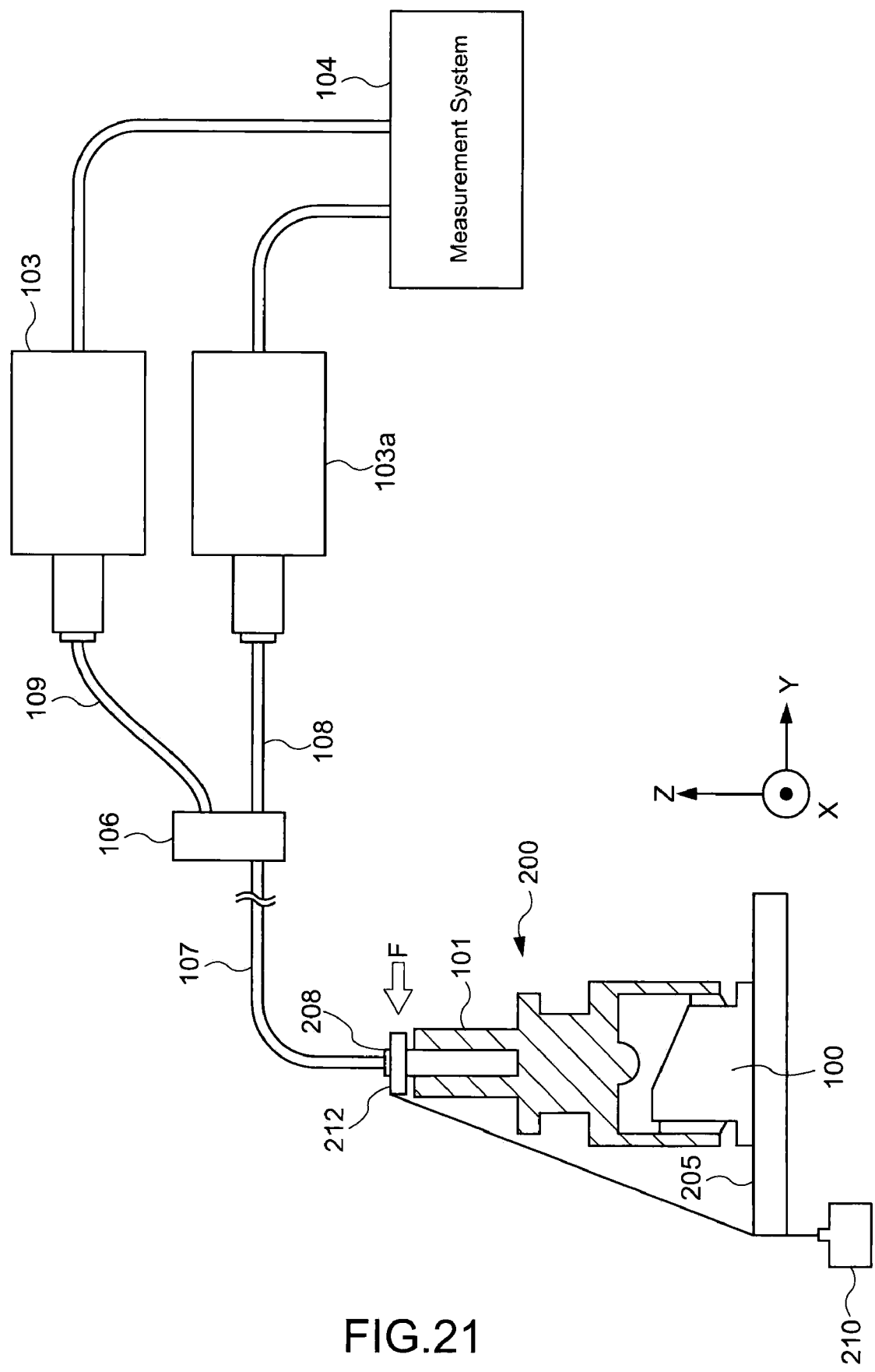
FIG. 21 is a block diagram for describing an example of the structure of an evaluation apparatus in the case of providing two optical systems.

FIG. 21 is a block diagram of an example of the structure of an evaluation apparatus when two optical systems are provided. The evaluation apparatus shown in FIG. 21 evaluates relative positions of the light emitting element included in the optical module 200 and the connector part (support member) 101. The evaluation apparatus includes optical fibers 107, 108 and 109, sensor units 103 and 103a, a measurement system 104, a fixing member 205, and a pressure application device 212.

By combining the optical fibers 107-109 and an optical branch 106, an "optical fiber equipped with a common one end and first and second other ends" is composed. The optical fiber 107 has one end mounted on the connector part 101. The other end of the optical fiber 107 and one end of each of the optical fibers 108 and 109 are connected to the optical branch 106. The sensor unit 103a is disposed at the side of the other end (first other end) of the optical fiber 108. The sensor unit 103 is disposed on the side of the other end (second other end) of the optical fiber 109. Light emitted from the other end of the optical fiber 107 is branched by the optical branch 106, and enters the one ends of the respective optical fibers 108 and 109. The sensor unit 103 has the structure described in detail above (see FIG. 3), and the diaphragm member 34 is disposed between the other end of the optical fiber 109 and the photodetector 32 (second photodetector) included in the sensor unit 103. Also, the sensor unit 103a has a structure in which the diaphragm member 34 is omitted from the sensor unit 103.

Next, a method for evaluating an optical module using the evaluation apparatus shown in FIG. 21 is described.

First, an optical module 200 is affixed to the fixing member 205. Then, a ferule 208 that is attached to one end of the optical fiber 107 is mounted on the connector part 101.

Next, while causing the light emitting element 10 within the optical module 200 to emit light, the position of one end of the optical fiber 107 is moved. The evaluation apparatus in accordance with the present embodiment uses the pressure application device 212 to apply a force F to the ferule 208, to thereby move the position of the one end of the optical fiber 107. Then, the amount of light is detected by the photodetector 32 within each of the sensor units 103 and 103a at each of the positions of the one end of the optical fiber 107. The amount of light detected by the photodetector 32 is sequentially taken as data in the measurement system 104.

Next, the measurement system 104 evaluates relative positions of the light emitting element 10 and the optical fiber 107, in other words, relative positions of the light emitting element 10 and the connector part 101 based on the amount of light detected by the photodetector 32 within the sensor unit 103. Also, the measurement system 104 measures light output of the light emitting element 10 based on the amount of light detected by the photodetector 32 within the sensor unit 103a.

In this manner, according to the fifth embodiment, characteristics of the amount of light detected by the photodetector, in other words, tolerance curves can be changed from a trapezoidal shape to a shape having a clear peak, through including the diaphragm member. By evaluating an optical module based on the tolerance curves, the evaluation can be accurately conducted in a short time. Further, because the evaluation apparatus described above can be installed in a manufacturing line for manufacturing optical modules 200, evaluation can be done in the course of manufacturing the optical modules. Accordingly, an evaluation technology suitable for mass-production of optical modules can be obtained.

2.2. Sixth Embodiment

In the fifth embodiment, peak characteristics are generated in tolerance curves by providing a diaphragm member. However, a diaphragm member may be disposed in the middle of an optical fiber.

Figure 22:
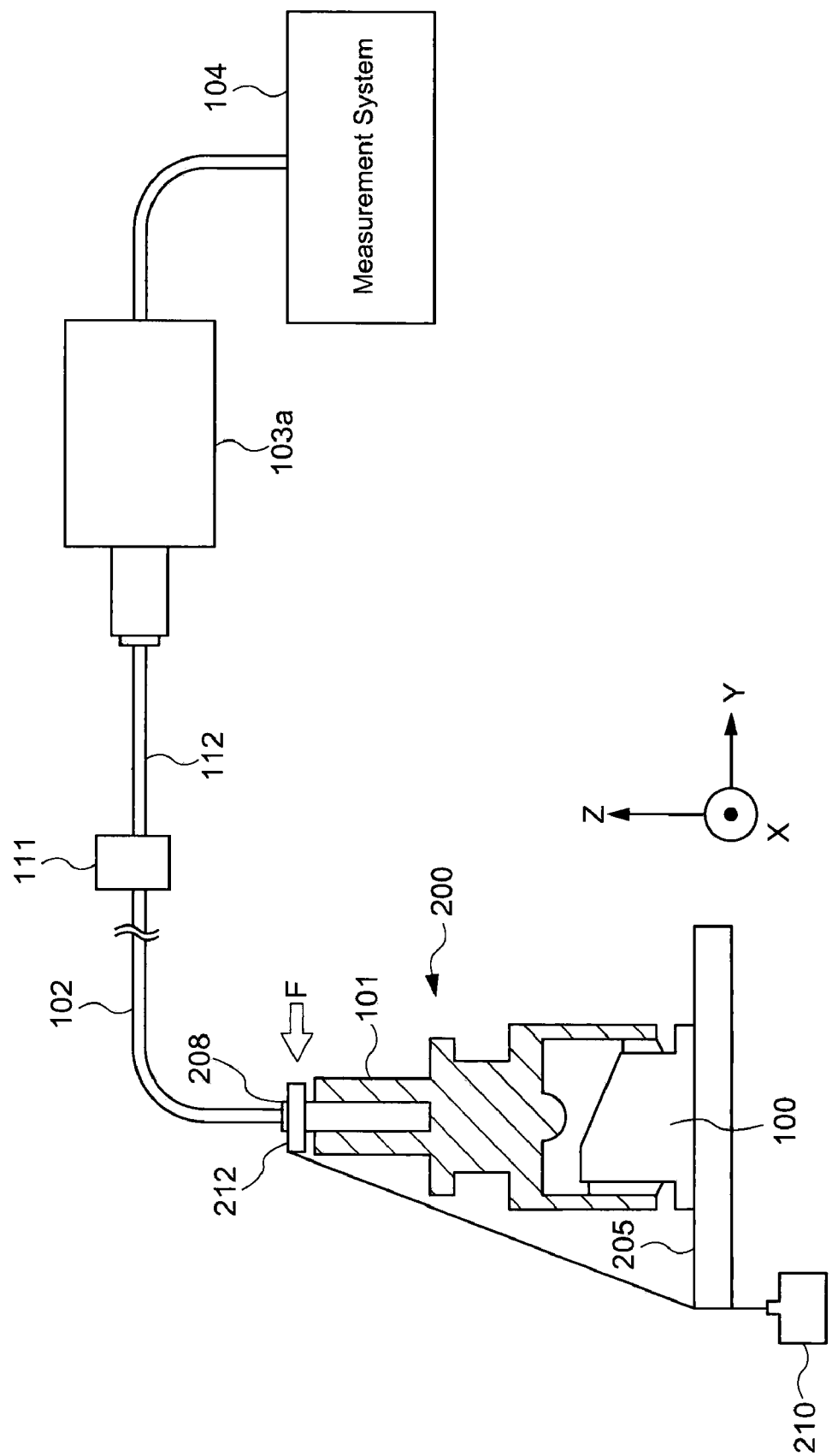
FIG. 22 is a block diagram for describing an example of the structure of an evaluation apparatus for evaluating an optical module in accordance with a sixth embodiment of the invention.

FIG. 22 is a schematic block diagram for describing the structure of an apparatus for manufacturing an optical module in accordance with a sixth embodiment of the invention. The evaluation apparatus shown in FIG. 22 is an apparatus for evaluating relative positions of a light emitting element included in an optical module 200 and a connector part (supporting member) 101. The evaluation apparatus includes optical fibers 102 and 112, a sensor unit 103a, a measurement system 104, a fixing member 205, an optical coupler 111, and a pressure application device 212.

The optical fiber 102 (first optical fiber for evaluation) has one end mounted on the connector part 101. It is noted here that the optical fiber 102 may be, for example, a GI (graded index) multimode fiber with an NA being 0.21, having a core diameter of 50 μm and a clad diameter of 125 μm.

The optical fiber 112 (second optical fiber for evaluation) has one end optically coupled to the other end of the optical fiber 102 by the optical coupler 111. It is noted here that the optical fiber 112 may be, for example, a GI (Graded Index) multimode fiber with an NA being 0.21, having a core diameter of 50 μm and a clad diameter of 125 μm.

The sensor unit 103a has a structure similar to the sensor unit 103 described above wherein the diaphragm member 34 is omitted from the sensor unit 103 (see FIG. 3), and is equipped with a photodetector 32 disposed on the side of the other end of the optical fiber 112.

Details of the optical coupler are generally the same as those of the optical couplers shown in FIG. 10 and FIG. 11, and therefore its description is omitted.

Figure 23:
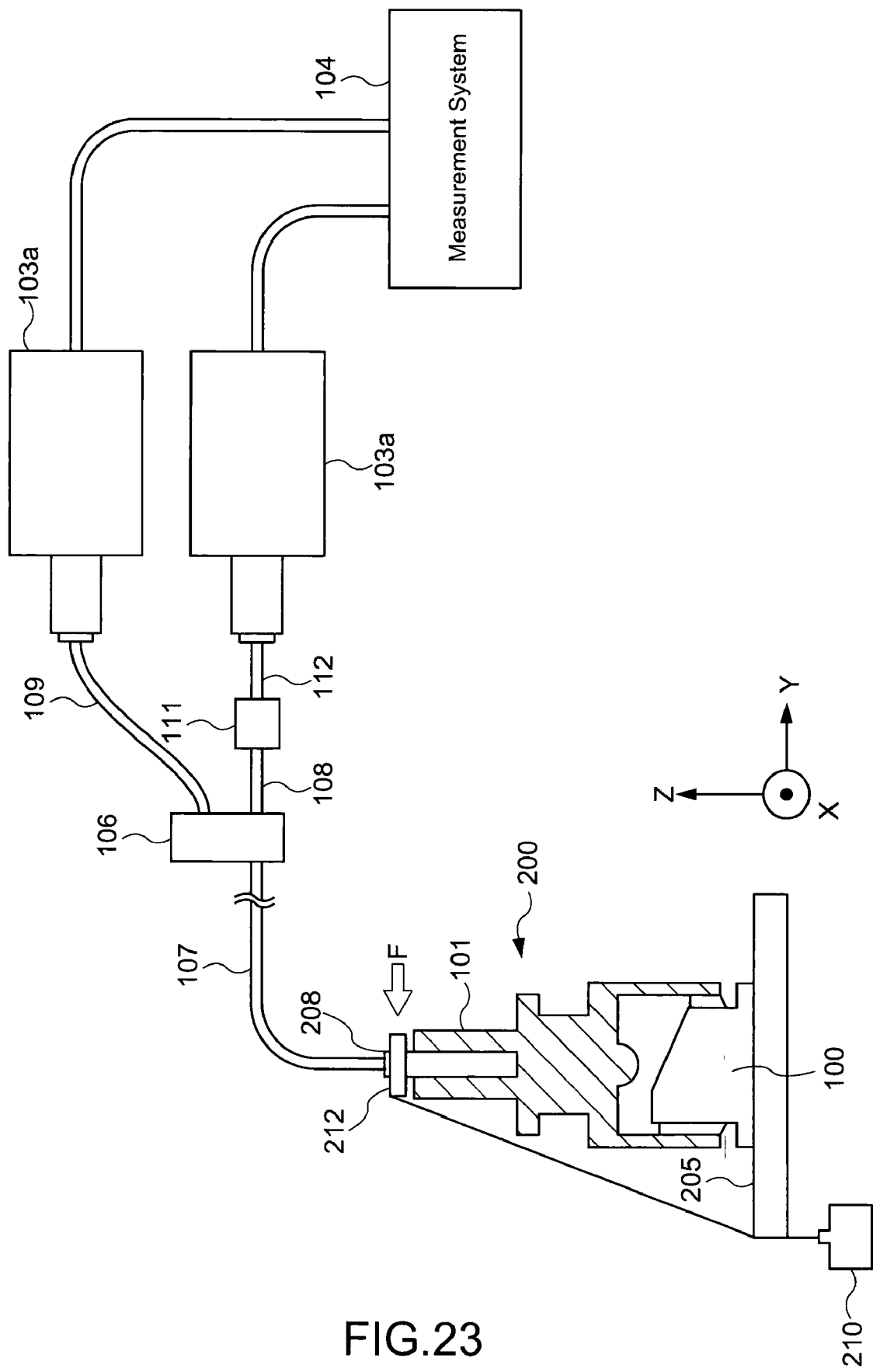
FIG. 23 is a block diagram for describing an example of the structure of an evaluation apparatus in the case of providing two optical systems.

FIG. 23 is a block diagram of an example of the structure of an evaluation apparatus when two optical systems are provided. The evaluation apparatus shown in FIG. 23 is an apparatus that evaluates relative positions of a light emitting element included in an optical module 200 and a connector part (supporting member) 101. The evaluation apparatus includes optical fibers 107, 108, 109 and 112, two sensor units 103a, a measurement system 104, a fixing member 205, an optical branch 106, an optical coupler 111, and a pressure application device 212.

By combining the optical fibers 107-109 and the optical branch 106, a "first optical fiber equipped with a common one end and first and second other ends" is composed. The optical fiber 107 has one end mounted on the connector part 101. The other end of the optical fiber 107 and one end of each of the optical fibers 108 and 109 are connected to the optical branch 106. The other end (first other end) of the optical fiber 108 is connected to the optical fiber 112 through the optical coupler 111. The sensor units 103a are disposed on the side of the other ends of the respective optical fibers 109 and 112. The structure of the sensor unit 103a is the same as that described in detail above. Light emitted from the other end of the optical fiber 107 is branched, and enters the one ends of the respective optical fibers 108 and 109.

A method for evaluating an optical module using the evaluation apparatus having the structure shown in FIG. 23 and described above is generally the same as that of the fifth embodiment, and therefore its description is omitted.

With the structure described above, peak characteristics of tolerance curves observed by the sensor unit 103 can be made conspicuous.

2.3 Seventh Embodiment

In accordance with the fifth and sixth embodiments, peak characteristics are generated on tolerance curves by providing a diaphragm member. However, similar effects can also be obtained by combining optical fibers having different core diameters.

The overall structure of the evaluation apparatus in accordance with the seventh embodiment is generally the same as that of the sixth embodiment, but the structure of an optical coupler and the relation in size between core diameters of optical fibers are changed. Therefore, illustration of the overall structure is omitted. Also, the optical coupler in accordance with the seventh embodiment is generally the same as that of the optical coupler 131 in accordance with the third embodiment (see FIG. 13), and therefore its description is omitted.

In this manner, the relation in size in core diameters may be utilized, whereby peak characteristics of tolerance curves observed by the sensor unit 103a can be made conspicuous.

2.4. Eighth Embodiment

Furthermore, as described below, peak characteristics can be generated in tolerance curves by setting the size of the light receiving surface of a photodetector smaller than the spot size of emission light emitted from an optical fiber.

Figure 24:
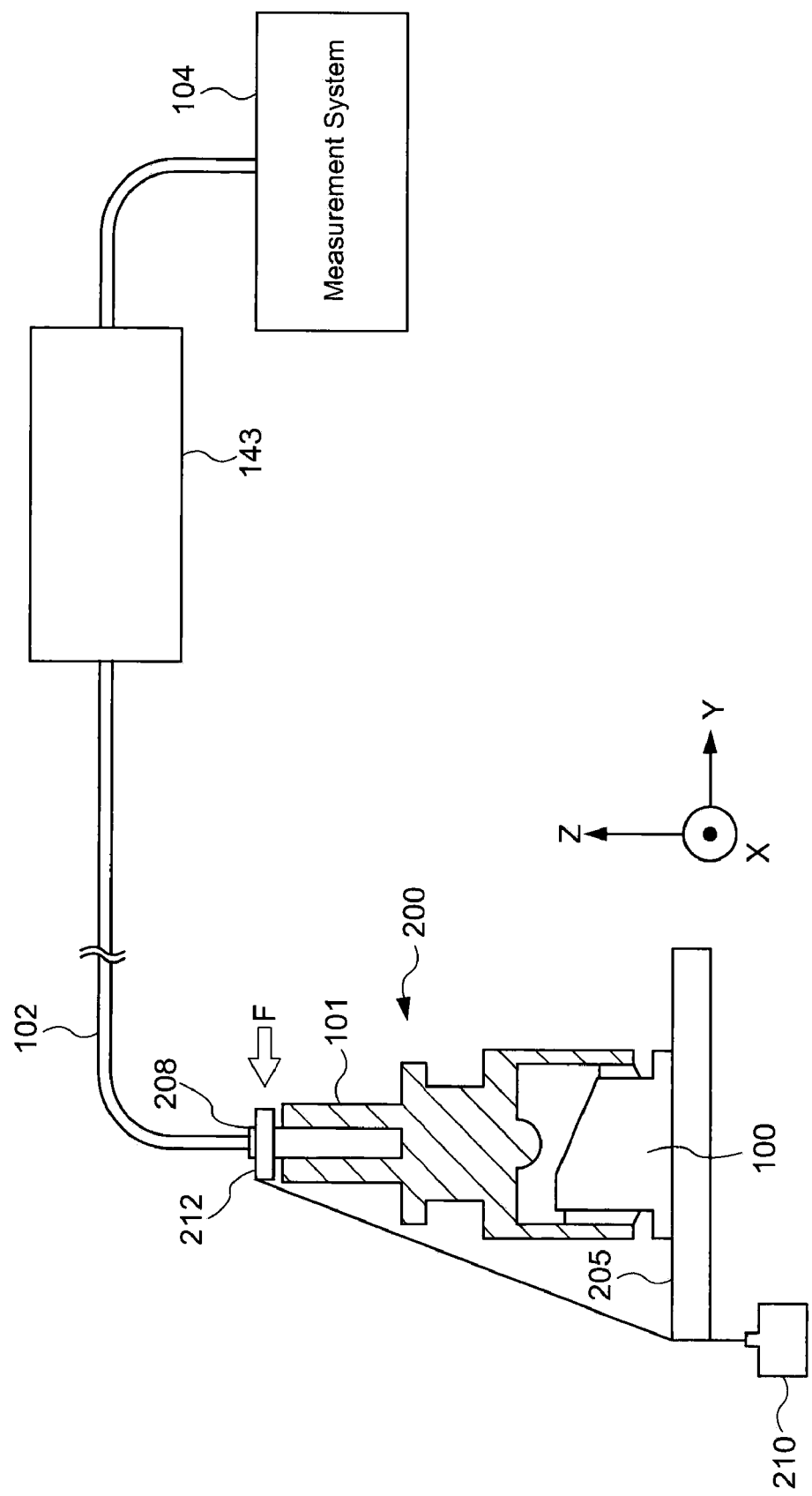
FIG. 24 is a block diagram for describing an example of the structure of an evaluation apparatus in accordance with a seventh embodiment of the invention.

FIG. 24 is a schematic block diagram for describing the structure of an apparatus for evaluating an optical module in accordance with an eighth embodiment of the invention. An evaluation apparatus shown in FIG. 24 is an apparatus that evaluates relative positions of a light emitting element included in an optical module 200 and a connector part (supporting member) 101. The evaluation apparatus includes an optical fiber 102, a sensor unit 143, a measurement system 104, a fixing member 205, and a pressure application device 212. Details of the structure of each of the components other than the sensor unit 143 are generally the same as those of the fourth embodiment described and shown in FIG. 15. Also, details of the structure of the sensor unit 143 are generally the same as those in accordance with the fourth embodiment.

By using the sensor unit 143 shown in FIG. 15, the light receiving surface of the photodetector can be set at a position that receives only a portion of components of light including an optical axis thereof emitted from the optical fiber 102. In other words, by adjusting the position of the light receiving surface of the photodetector, the light receiving surface can be made smaller relative to a spot of the emission light emitted from the other end of the optical fiber 102.

It is noted that a sensor unit having a photodetector that is capable of receiving the entire emission light emitted from the optical fiber may be provided together with the sensor unit 143 described above.

Figure 25:
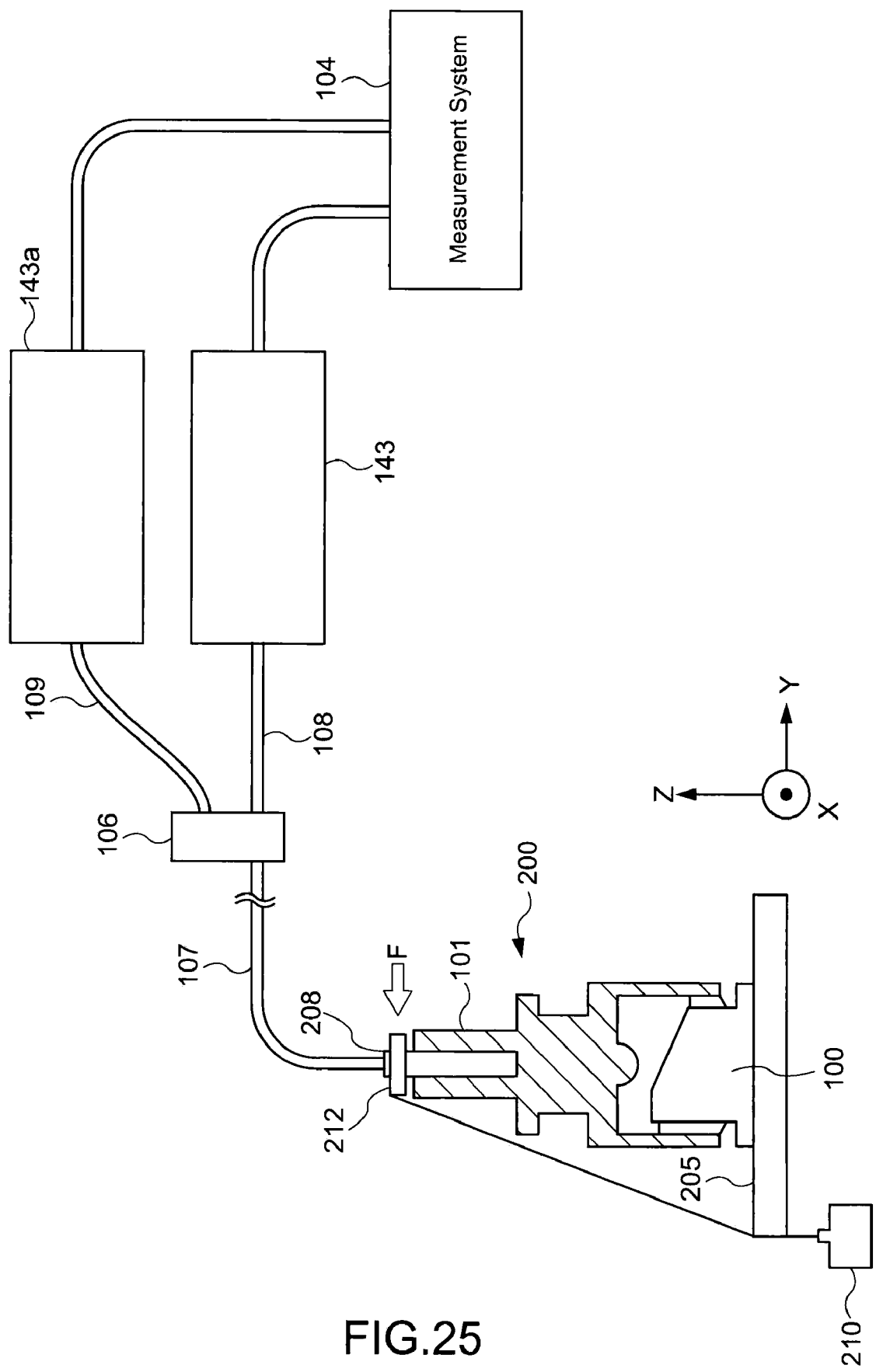
FIG. 25 is a block diagram for describing an example of the structure of an evaluation apparatus in the case of providing two optical systems.

FIG. 25 is a block diagram of an example of the structure of an evaluation apparatus when two sensor units are provided. The evaluation apparatus shown in FIG. 25 includes optical fibers 107, 108 and 109, two sensor units 143 and 143a, a measurement system 104, a fixing member 205, an optical branch 106, and a pressure application device 212.

The optical fiber 107 has one end mounted on the connector part. The other end of the optical fiber 107 and one end of each of the optical fibers 108 and 109 are connected to the optical branch 106, and light emitted from the other end of the optical fiber 107 is branched by the optical branch 106, and enters the one ends of the respective optical fibers 108 and 109. By combining the optical fibers 107-109 and the optical branch 106, an "optical fiber equipped with a common one end and first and second other ends" is composed. The sensor units 143 and 143a are disposed on the side of the other ends of the optical fibers 108 and 109, respectively. The sensor unit 143 has the structure described in detail above. Also, the sensor unit 143a has a structure similar to the sensor unit 143, wherein the mutual distance d between the other end of the optical fiber 109 and the photodetector 32a is made shorter such that the entire components of the emission light emitted from the optical fiber 109 (components corresponding to an emission angle $\theta_2$ shown in FIG. 16) is incident upon the light receiving surface 36a. For example, when the diameter r of the light receiving surface 36a is 13 mm, the mutual distance d between the other end of the optical fiber 109 and the photodetector 32a is 16 mm. It is noted that a method for evaluating an optical module using the evaluation apparatus having the structure shown in FIG. 24 and FIG. 25 described above is substantially the same as that of the fifth embodiment, and therefore its description is omitted.

In this manner, the relation in size between a spot of emission light and a light receiving surface may be utilized to generate a shade to light that enters the optical fiber 32a, whereby peak characteristics of tolerance curves observed by the sensor unit 143 can be made conspicuous.

3. Other Embodiments

It is noted that the invention is not limited to the details of each of the embodiments described above, and many modifications can be made within the scope of the subject matter of the invention. For example, in the embodiments described above, a pin-hole plate having an opening is used as an example of a diaphragm member, but the structure of the diaphragm member is not limited to such a structure. For example, a diaphragm member may be composed of a shading film having an opening formed on a surface of a transparent plate. Furthermore, in the embodiments described above, positioning of a light emitting element sealed in a can and a connector part is described. However, the invention is also applicable to light emitting elements that are not sealed in cans.

What is claimed is:

1. An apparatus for evaluating an optical module, the optical module including a light emitting element and a supporting member by which relative positions of the light emitting element and the supporting member are evaluated, the apparatus comprising:

an optical fiber for evaluation having one end supported by the supporting member of the optical module;

a photodetector that is provided at the other end of the optical fiber for evaluation and detects the amount of only a portion of components of light including an optical axis thereof emitted from the light emitting element; and a diaphragm member provided between the light emitting element and the photodetector that transmits only a portion of components of light including an optical axis thereof emitted from the light emitting element;

wherein the optical fiber for evaluation has a first optical fiber for evaluation having one end supported by the supporting member and a second optical fiber for evaluation that is optically coupled with the other end of the first optical fiber for evaluation; and wherein the diaphragm member is provided between the first optical fiber for evaluation and the second optical fiber for evaluation.

2. An apparatus for evaluating an optical module according to claim 1, wherein a light receiving surface of the photodetector is smaller than a spot diameter of light emitted from the optical fiber for evaluation.

3. An apparatus for evaluating an optical module according to claim 1, wherein the optical fiber for evaluation has a core diameter that is smaller than a spot diameter of light emitted from the light emitting element at the one end of the optical fiber for evaluation.

4. An apparatus for evaluating an optical module according to claim 1, further comprising a pressure application device to apply a force to the optical fiber for evaluation for moving the position of one end of the optical fiber for evaluation.

5. An apparatus for evaluating an optical module, the optical module including a light emitting element and a supporting member by which relative positions of the light emitting element and the supporting member are evaluated, the apparatus comprising:

an optical fiber for evaluation having one end supported by the supporting member of the optical module;

a photodetector that is provided at the other end of the optical fiber for evaluation and detects the amount of only a portion of components of light including an optical axis thereof emitted from the light emitting element; and a pressure application device that applies a force to the optical fiber for evaluation for moving the position of one end of the optical fiber for evaluation.

6. An apparatus for evaluating an optical module, the optical module including a light emitting element and a supporting member by which relative positions of the light emitting element and the supporting member are evaluated, the apparatus comprising:

an optical fiber for evaluation having one end supported by the supporting member of the optical module; and a photodetector that is provided at the other end of the optical fiber for evaluation and detects the amount of only a portion of components of light including an optical axis thereof emitted from the light emitting element;

wherein a light receiving surface of the photodetector is smaller than a spot diameter of light emitted from the optical fiber for evaluation.

* * * * *